United States Patent [19]

Mashiko

[11] Patent Number: 6,034,563

[45] Date of Patent: *Mar. 7, 2000

[54] SEMICONDUCTOR INTEGRATED CIRCUIT HAVING REDUCED CURRENT LEAKAGE AND HIGH SPEED

[75] Inventor: Koichiro Mashiko, Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/651,588

[22] Filed: May 22, 1996

[30] Foreign Application Priority Data

Oct. 19, 1995 [JP] Japan ..................... 7-271574

[51] Int. Cl.$^7$ ...................................... G05F 1/10

[52] U.S. Cl. ........................................ 327/544; 327/377

[58] Field of Search ..................... 327/390, 589, 327/377, 170, 108–112, 544; 326/88, 80, 81

[56] References Cited

U.S. PATENT DOCUMENTS

| | | | |
|---|---|---|---|
| 4,904,885 | 2/1990 | Yamada et al. | 327/536 |
| 5,041,739 | 8/1991 | Goto | 327/536 |
| 5,128,560 | 7/1992 | Chern et al. | 326/81 |
| 5,159,214 | 10/1992 | Okumura | 326/110 |
| 5,321,324 | 6/1994 | Hardee et al. | 326/80 |
| 5,461,338 | 10/1995 | Hirayama et al. | 327/534 |
| 5,528,173 | 6/1996 | Merritt et al. | 326/81 |

FOREIGN PATENT DOCUMENTS

| | | |
|---|---|---|
| 0 690 510 | 1/1996 | European Pat. Off. . |
| 1-289137 | 11/1989 | Japan ..................... 327/544 |
| 5-48424 | 2/1993 | Japan ..................... 327/544 |
| 6-29834 | 2/1994 | Japan . |
| 7-212217 | 8/1995 | Japan . |

OTHER PUBLICATIONS

MTC MOS Logic Circuit Technology, "Intention of Decreasing the Electric Power Consumption for LSI—1 V. Small Power Consumption High–speed Operation", Densi–Gijutsu (Electronics Technology) 1994–9, pp. 29–32.

Primary Examiner—Kenneth B. Wells
Attorney, Agent, or Firm—Oblon, Spivak, McClelland, Maier & Neustadt, P.C.

[57] ABSTRACT

A semiconductor integrated circuit including a first MOS transistor supplied with a first power supply voltage and having a high threshold voltage; a second MOS transistor supplied with a second power supply voltage and having the high threshold voltage; a logic circuit connected between the first transistor and the second transistor and including a plurality of MOS transistors having a low threshold voltage; a control circuit for generating a control signal when the logic circuit is in a standby state; and a voltage generating circuit for generating a first voltage which is a higher than the first power supply voltage and a second voltage which is a lower than the second power supply voltage, for supplying the first voltage to a gate of the first MOS transistor and for supplying the second voltage to a gate of the second MOS transistor when the logic circuit is in the standby state, thereby to decrease leakage current through the first and second transistors and through the logic circuit when in the standby state.

34 Claims, 11 Drawing Sheets

(A)  (B)

SEMICONDUCTOR INTEGRATED CIRCUIT HAVING REDUCED CURRENT LEAKAGE AND HIGH SPEED

BACKGROUND OF THE INVENTION

1. Field of the Invention

This invention relates to a semiconductor integrated circuit, for example, a logic circuit, exhibiting decreased leakage current and increased processing speed during operation under control of a state signal from a control circuit.

2. Discussion of Background

In recent years, semiconductor integrated circuits are used in various technical fields thanks to advances in semiconductor technology. But the semiconductor integrated circuit, for example a microprocessor which includes CMOS technology, has two important problems involving input power consumption and device speed. It is difficult to solve the two problems and achieve low input power consumption and high speed performance at the same time, for example, using CMOS technology.

Recently, MT-CMOS (Multi-Threshold CMOS) has been developed in an attempt to solve the two problems at the same time. FIG. 19 shows a circuit diagram of an MT-CMOS semiconductor integrated circuit which is used in a compact information terminal. The MT-CMOS integrated circuit includes a transistor having a high threshold voltage and a transistor having a low threshold voltage. In FIG. 19, the MT-CMOS semiconductor integrated circuit includes a p type MOS transistor Q1, an n type MOS transistor Q2, a potential line VDDV (hereinafter referred to as "VDDV"), a potential line GNDV (hereinafter referred to as "GNDV"), and a logic circuit 11 shown in dotted line. The transistors in the logic circuit have a low threshold voltage. The p type MOS transistor Q1 and the n type MOS transistor Q2 each have a high threshold voltage. VDDV is supplied with VDD via transistor Q1. GNDV is supplied with GND via transistor Q2. The logic circuit is composed of CMOS transistors powered by VDDV and GNDV. The gate of the p type MOS transistor Q1 is connected to a signal line SL, the source of the p type MOS transistor Q1 is supplied with VDD and the drain of the p type MOS transistor Q1 is connected to VDDV. The gate of the n type MOS transistor Q2 is connected to a signal line $\overline{SL}$, the drain of the n type MOS transistor Q2 is supplied with GND and the source of the n type MOS transistor Q2 is connected to GNDV. The signal lines SL and $\overline{SL}$ are complementary digital signals.

When the level of the signal line SL is a high level ("H", e.g., VDD) and the level of the signal line $\overline{SL}$ is a low level ("L", e.g., GND), the logic circuit is non-conducting because both the p type MOS transistor Q1 and the n type MOS transistor Q2 are in the "OFF" state as the logic circuit 11 is not supplied with VDD and GND. This state is the standby state.

When the level of the signal line SL is "L" and the level of the signal line $\overline{SL}$ is "H", both the p type MOS transistor Q1 and the n type MOS transistor Q2 are "ON" and the logic circuit is supplied with VDD and GND. This state is the active state.

A threshold voltage of the p type MOS transistor Q1 is −0.5−−0.7 V and a threshold voltage of the n type MOS transistor Q2 is 0.5−0.7 V. The threshold voltage of each p type MOS transistor and that of each n type MOS transistor in the logic circuit are −0.2−−0.3 V and 0.2−0.3 V, respectively. Because the threshold voltages of the MOS transistors in the logic circuit 11 are low, the logic circuit 11 can perform logic functions at a low voltage (about 1 V) when in the active state. Because the threshold voltages of the p type MOS transistor Q1 and the n type MOS transistor Q2 are at a higher voltage than that of the transistors in the logic circuit, the leakage current is decreased when in the standby state.

Generally, when in the standby state, the leakage current (a subthreshold current) is generated in the MOS transistor. When the threshold voltage (Vth) decreases to 0.1 V, the leakage current increases at least 10 times. Therefore, in such a case, the leakage current of the MOS transistors having a low threshold voltage (in the logic circuit) becomes not less than 1,000 times that of the MOS transistors having a high threshold voltage (i.e., the p type MOS transistor Q1 and the n type MOS transistor Q2).

But, in FIG. 19, when in the standby state, the leakage current is not generated in the logic circuit, because the p type MOS transistor Q1 and the n type MOS transistor Q2 are turned OFF by the signals SL and $\overline{SL}$. Thus, the semiconductor integrated circuit of FIG. 19 has only the leakage currents of the p type MOS transistor Q1 and the n type MOS transistor Q2 when in the standby state. Therefore, the input power consumption of the MT-CMOS logic circuit is low (1/1,000 or less than that without the MOS transistors Q1 and Q2 (n-MT-CMOS)), because the leakage current of the logic circuit is not generated when in the standby state.

FIG. 20 is a sectional view of a semiconductor chip to realize the CMOS transistor circuits. In FIG. 20, the semiconductor chip includes a silicon substrate 1 in which a p type well 2 and an n type well 3 are formed. A plurality of n type semiconductor regions 4a–4d are formed in the p type well 2, a plurality of p type semiconductor regions 5a–5d are formed in the n type well 3, a plurality of n type gate electrodes 6a–6c are formed on the p type well 2 through an insulating layer (not shown), a plurality of p type gate electrodes 7a–7c are formed on the n type well 3 through an insulating layer (not shown), an isolation layer 8 is formed to separate the p type well 2 and the n type well 3, a p type semiconductor region 9 have a higher impurity concentration than the rest of the well 2 is formed in the p type well 2, and an n type semiconductor region 10 have a higher impurity concentration than the rest of the well 3 is formed in the n type well 3.

The logic circuit 11 includes a transistor T1 which consists of the n type semiconductor regions 4b, 4c and the gate electrode 6b, an transistor T2 which consists of the n type semiconductor regions 4c, 4d and the gate electrode 6c, a transistor T3 which consists of the p type semiconductor regions 5c, 5d and the gate electrode 7b and a transistor T4 which consists of the p type semiconductor regions 5c, 5d and the gate electrode 7c. The p type MOS transistor Q1 consists of the p type semiconductor regions 5a, 5d and the gate electrode 7a. The n type MOS transistor Q2 consists of the n type semiconductor regions 4a, 4b and the gate electrode 6a. The gate electrode 7a and the gate electrode 6a are connected to the signal line SL and the signal line $\overline{SL}$, respectively. The n type semiconductor region 10 and the p type semiconductor region 9 are formed with a higher impurity concentration to provide the p type MOS transistor Q1 and the n type MOS transistor Q2 with a higher threshold voltage compared to that of the transistors T1, T2, T3 and T4.

In the p type well 2, the n type semiconductor regions 4a, 4b, 4c, 4d are formed at the same time by the same doping process. After that process, the p type semiconductor region 9 is formed between n type semiconductor region 4a and n type semiconductor region 4b by ion implantation of aluminum ions or boron ions. Then, in the n type well 3, the p type semiconductor regions 5a, 5b, 5c, 5d are formed at the same time by the same doping process. After that process, the n type semiconductor region 10 is formed between the n type semiconductor region 5a and the n type semiconductor region 5b by ion implantation of phosphorus ions.

In the above semiconductor integrated circuit, a low input power consumption is desired. The threshold voltages (absolute value) of the p type MOS transistor Q1 and the n type MOS transistor Q2 are designed so as not to generate a large leakage current in the standby state between the power supply (VDD and GND) and the logic circuit 11.

However, it is difficult to obtain the desired threshold voltage by the impurity doping process at the present level of technical skill in semiconductor manufacturing. As a result, not only is low input power consumption not achieved, but also manufacturing yield decreases due to sub-standard MOS transistors.

Further, the provision of low voltage threshold MOS transistors and high voltage threshold MOS transistors on a common semiconductor substrate in the above semiconductor integrated circuit results in a complicated manufacturing process due to the extra doping steps required to dope an impurity in the channel region 9 of the p type MOS transistor Q1 and in the channel region 10 of the n type MOS transistor Q2, as well as the concomitant masks required to dope the impurities in the semiconductor integrated circuit. As a result, the manufacturing productivity is remarkably reduced.

Still further, it is not possible to ignore the ON resistance of the p type MOS transistor Q1 and that of the n type MOS transistor Q2 shown in FIG. 19. These ON resistances prevent high performance of the logic circuit. For example, even though the threshold voltage of the p type MOS transistor Q1 is reduced, or the threshold voltage of n type MOS transistor Q2 is increased, although the leakage current is thereby decreased, when the MOS transistors is in the ON state, the ability to drive the MOS transistors is prevented by such threshold voltages.

SUMMARY OF THE INVENTION

Accordingly, one object of the present invention is to provide a novel semiconductor integrated circuit exhibiting low input power consumption due to decreased the leakage current generated between a logic circuit and a power supply when in the standby state.

Another object of this invention is to improve the performance speed of the logic circuit in the semiconductor integrated circuit when in the active state.

These and other objects are achieved by providing a new and improved semiconductor integrated circuit including a first MOS transistor supplied with a first power supply voltage and having a high threshold voltage; a second MOS transistor supplied with a second power supply voltage and having the high threshold voltage; a logic circuit connected between the first transistor and the second transistor and including a plurality of MOS transistors having a low threshold voltage; a control circuit for generating a control signal when the logic circuit is in a standby state; and a voltage generating circuit for generating a first voltage which is a higher than the first power supply voltage and a second voltage which is a lower than the second power supply voltage, for supplying the first voltage to a gate of the first MOS transistor and for supplying the second voltage to a gate of the second MOS transistor when the logic circuit is in the standby state, thereby to decrease leakage current through the first and second transistors and through the logic circuit when in the standby state.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
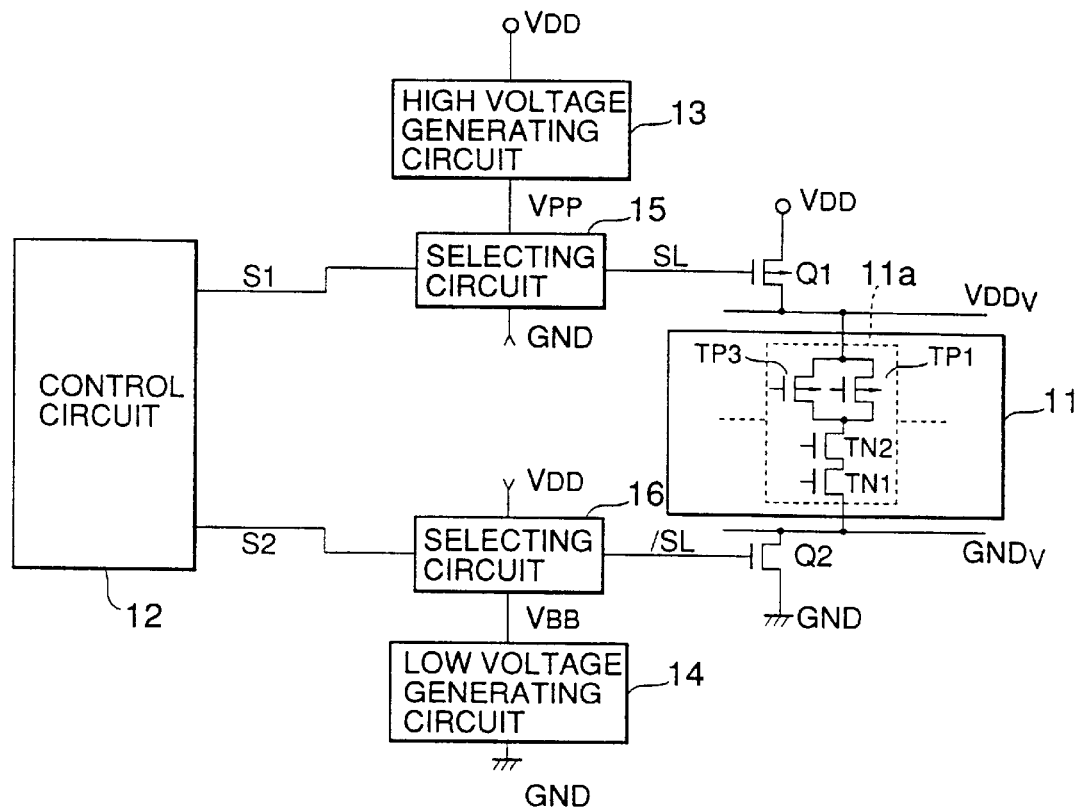
FIG. 1 is a circuit diagram of a first embodiment of a semiconductor integrated circuit of the present invention.

Referring now to the drawings, wherein like reference numerals designate identical or corresponding parts throughout the several views, various embodiments of the present invention are next described.

(First Embodiment)

A first embodiment of the present invention is first described with reference to FIGS. 1–7.

FIG. 1 shows a circuit diagram of a semiconductor integrated circuit of the first embodiment of the present invention, including a logic circuit 11, a control circuit 12, a high voltage generating circuit 13, a low voltage generating circuit 14, selecting circuits 15, 16, a power supply VDD (hereinafter referred to as "VDD"), a ground voltage GND (OV) (hereinafter referred to as "GND"), a potential power line VDDV, a potential ground line GNDV, a p channel transistor Q1, and an n channel transistor Q2. The logic circuit 11 includes a NAND gate 11a having transistors TP1 (p type), TP2 (p type), TN1 (n type) and TN2 (n type). A gate of the p channel transistor Q1 is connected to a signal line SL from the selecting circuit 15. A gate of the n type MOS transistor is connected to a signal line $\overline{SL}$ from the selecting circuit 14. The p type MOS transistor Q1 is connected to the logic circuit 11 through VDDV. The n type MOS transistor Q2 is connected to the logic circuit 11 through GNDV. The high voltage generating circuit 13 generates a voltage VPP higher than VDD, and supplies VPP to the selecting circuit 15. The low voltage generating circuit 14 generates a voltage VBB lower than GND, and supplies VBB to the selecting circuit 16. The control circuit 12 is connected to the selecting circuit 15 through a signal line S1 and is connected to the selecting circuit 16 through a signal line S2. The selecting circuit 12 generates control signals for controlling a standby state and an active state in the logic circuit 11, and supplies the selecting circuits 15 and 16 with the control signals through the signal line S1 and S2. The selecting circuit 15 selectively outputs VPP or GND in response to the level of the signal from the control circuit 12 through the signal line S1. The signal selected by the selecting circuit 15 is supplied to the gate of the p type MOS transistor Q1 through the signal line SL. The selecting circuit 16 selectively outputs VBB or VDD in response to the level of the signal from the transistor circuit 12 through the signal line S2. The signal selected by the selecting circuit 16 is supplied to the gate of the n type MOS transistor Q2. The transistors Q1 and Q2 serve as switching circuits for supplying or cutting off VDD and GND to the logic circuit 11.

Figure 2:
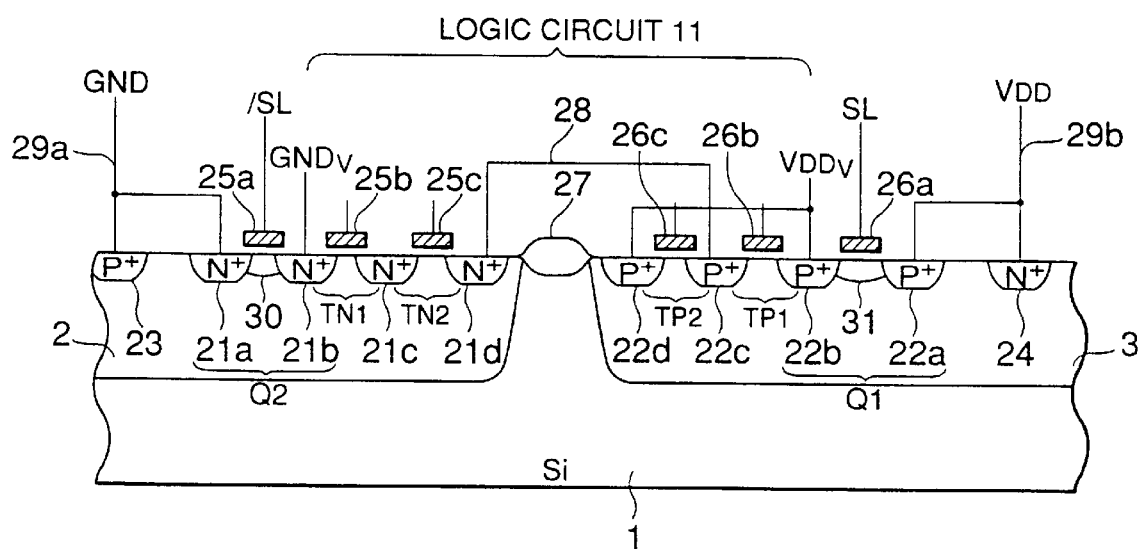
FIG. 2 is a sectional view of NAND gate 11a, p type MOS transistor Q1 and n type MOS transistor Q2 of the semiconductor integrated circuit of FIG. 1.

FIG. 2 is a sectional view of the logic circuit (NAND gate) 11, p type MOS transistor Q1 and n type MOS transistor Q2 of the semiconductor integrated circuit of FIG. 1. The semiconductor integrated circuit is formed of CMOS transistors. In FIG. 2, the semiconductor integrated circuit includes a plurality of n type semiconductor regions 21a–21d formed in a p type well 2, a plurality of p type semiconductor regions 22a–22d formed in an n type well 3, a p type region 23 having a high impurity concentration, an n type region 24 having a high impurity concentration, a plurality of gate electrodes 25a–25c formed on the p type well 2 through an insulating layer (not shown), a plurality of gate electrodes 26a–27c formed on the n type well 3 through an insulating layer (not shown), an isolation layer 27 is formed to separate the p type well 2 and the n type well 3, a wiring 28 is for connecting the n type semiconductor region 21d and the p type semiconductor region 22c, a wiring 29a which supplies GND to the n type semiconductor region 21a and the p type region 23, a wiring 29b which supplies VDD to the p type semiconductor region 22a and the n type region 24, a region 30 which is between the n type semiconductor region 21a and the n type semiconductor region 21b and has a higher impurity concentration than the rest of the p type well 2, a region 31 which is between the p type semiconductor region 22a and the p type semiconductor region 22b and has a higher impurity concentration than the rest of the n type well 3.

The n type MOS transistor TN1 includes the n type semiconductor regions 21b, 21c as a source region and a drain region, and the gate electrode 25b. The n type MOS transistor TN2 includes n type semiconductor regions 21c, 21d as a source region and a drain region and the gate electrode 25c. The p type MOS transistor TP1 includes the p type semiconductor regions 22b, 22c as a source region and a drain region and the gate electrode 26b. The p type MOS transistor TP2 includes the p type semiconductor regions 22c, 22d as a source region and a drain region and the gate electrode 26c. The wiring 28 connects the n type MOS transistor TN2 to the p type MOS transistors PN1 and PN2, a wiring connected to the n type semiconductor region 21b corresponds to GNDV, and a wiring connected to the p type regions 22b and 22d corresponds to VDDV.

The n type MOS transistor Q2 includes the n type semiconductor regions 21a, 21b as a source region and a drain region and the gate electrode 25a. The p type MOS transistor Q1 includes the p type semiconductor regions 22a, 22b as a source region and a drain region, and a gate electrode 26a. The wiring 29a supplies GND to the n type semiconductor region 21a (the source region of the n type MOS transistor Q2). The wiring 29b supplies VDD to the p type semiconductor region 22a (the source region of the p type MOS transistor Q1). The wiring 29a supplies GND to the p type region 23 as a backgate electric potential of the MOS transistors which are formed on the p type well 2. The wiring 29b supplies VDD to the n type region 24 as a backgate electric potential of the MOS transistors which are formed in the n type well 3.

A threshold voltage of the n type MOS transistors of the logic circuit 11 is 0.2 V–0.3 V. A threshold voltage of the n type MOS transistor Q2 is a higher voltage (for example 0.6 V) than 0.2 V–0.3 V, because of the channel region 30. A threshold voltage of the p type MOS transistors of the logic circuit 11 is –0.2 V—0.3 V. A threshold voltage of the p type MOS transistor Q1 is a lower voltage (for example –0.6 V) than –0.2 V—0.3 V, because of the channel region 31.

Moreover, there may be other logic circuits in addition to or in the alternative to the NAND gate 11a included in the logic circuit 11. Although these logic circuits are not shown in FIG. 2, n type MOS transistors may be formed in another portion of the p type well 2, and p type MOS transistors may be formed in another portion of the n type well 3. Although the control circuit 12, the high voltage generating circuit 13, the low voltage generating circuit 14, the selecting circuits 15 and 16 of FIG. 1 are not shown in FIG. 2, these circuits are likewise formed on the same semiconductor substrate.

Figure 3:
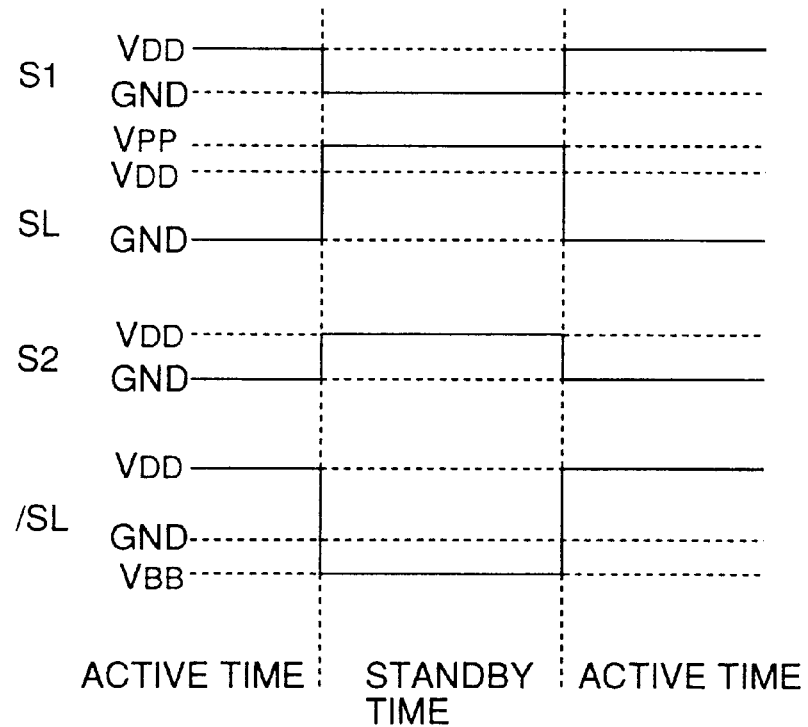
FIG. 3 is a timing diagram of signals indicating operation of the semiconductor integrated circuit of FIG. 1.

FIG. 3 is a timing diagram of the operation of the semiconductor integrated circuit in FIG. 1, showing signals on the signal lines S1, S2, SL and $\overline{SL}$.

The control circuit 12 decides whether the logic circuit 11 is to be set to an active state or a standby state based on a signal from another circuit (not shown). For example, in a personal computer, when the activity detection circuit detects no input activity for a fixed period of time from an input circuit, such as a key board or a mouse, etc., which would cause operation of the logic circuit 11, the activity detection circuit outputs a signal indicating that the personal computer or the logic circuit 11 is in the standby state. As FIG. 3 shows, when the logic circuit 11 is in the active state, the control circuit 12 applies VDD to the signal line S1, and, when the logic circuit 11 is in the standby state, the control circuit 12 applies GND to the signal line S1. When the logic circuit 11 is in the active state, the control circuit 12 applies GND to the signal line S2. And, when the logic circuit 11 is in the standby state, the control circuit 12 applies VDD to the signal line S2.

The selecting circuit 15 selects GND when the signal line S1 is a high level (VDD) or selects VPP when the signal line S1 is a low level (GND), and outputs a selected signal to the signal line SL. The selecting circuit 16 selects VBB when the signal line S2 is a high level (VDD) or selects VDD when the signal line S2 is a low level (GND), and outputs a selected signal to the signal line $\overline{SL}$. Therefore, as FIG. 3 shows, the signal line SL is GND when the logic circuit 11 is in the active state or the signal line SL is VPP when the logic circuit 11 is in the standby state. The signal line $\overline{SL}$ is VDD when the logic circuit 11 is in the active state or the signal line $\overline{SL}$ is VBB when the logic circuit 11 is in the standby state.

The p type MOS transistor Q1 and the n type MOS transistor Q2 are in the ON state, when the logic circuit 11 is in the active state, because the gate electrode of the p type MOS transistor Q1 is supplied with GND and that of the n type MOS transistor Q2 is supplied with VDD. Therefore, as VDDV is supplied with VDD and GNDV is supplied with GND, the logic circuit 11 executes logically using VDDV and GNDV as a power supply. The logic circuit 11 can operate even with a voltage smaller than VDD, because the MOS transistors in the logic circuit 11 can operate with a small threshold voltage (0.2 V–0.3 V in the absolute value).

When the logic circuit 11 is in the standby state, both the p type MOS transistor Q1 and the n type MOS transistor Q2 are in OFF state, because the gate electrodes of the p type MOS transistor Q1 and the n type MOS transistor Q2 are supplied with VPP and VBB, respectively.

For the example of the n type MOS transistor, the leakage current is known to vary as a function of the following formula:

$$\exp\{(V_{GS}-V_{th})/s\}$$

where VGS is a potential difference between the gate voltage and source voltage, Vth is a threshold voltage of the n type MOS transistor, and s is a voltage (fixed value) which needs to change a subthreshold leakage current value by a factor of ten. The smaller the voltage which is supplied to the n type MOS transistor Q2, the smaller the subthreshold leakage current. Similarly, the higher the voltage which is supplied to the p type MOS transistor Q1, the smaller the subthreshold leakage current.

Generally, during the manufacturing process, there is a very strong possibility that the threshold voltages of MOS transistors will vary and not be exactly as designed. For example, in FIG. 2, the regions 30 and 31 are doped with an impurity by a respective ion implantation. The actual threshold voltage of the region 30 may be 0.55 v, although the threshold voltage is designed to be 0.6 V. The actual threshold voltage of the region 31 may be −0.55 V, although the threshold voltage is designed to be −0.6 V.

As the formula shows, if the threshold voltage decreases, the leakage current increases. In the example of the n type MOS transistor Q2, if the threshold voltage of the n type MOS transistor Q2 decreases by 0.05 V lower than the numerical design value, the leakage current remarkably increases over the numerical design value. When GND is supplied to the gate electrode of the n type MOS transistor Q2, a large leakage current of more than the maximum permissible transistor current is generated in the n type MOS transistor Q2. Therefore, the n type MOS transistor Q2 is rejected as sub-standard during quality control examination.

In this invention, the above large leakage current can be decreased, because the gate electrode of the n type MOS transistor Q2 is supplied with VBB which is a lower than GND.

Similarly, when the p MOS transistor Q1 is in OFF state, the above large leakage current can be decreased, because the gate electrode of the p type MOS transistor Q1 is supplied with VPP which is a greater than VDD. Therefore, the input power consumption can be decreased, and the manufacturing yield improves, because fewer MOS transistors are rejected.

Figure 4:
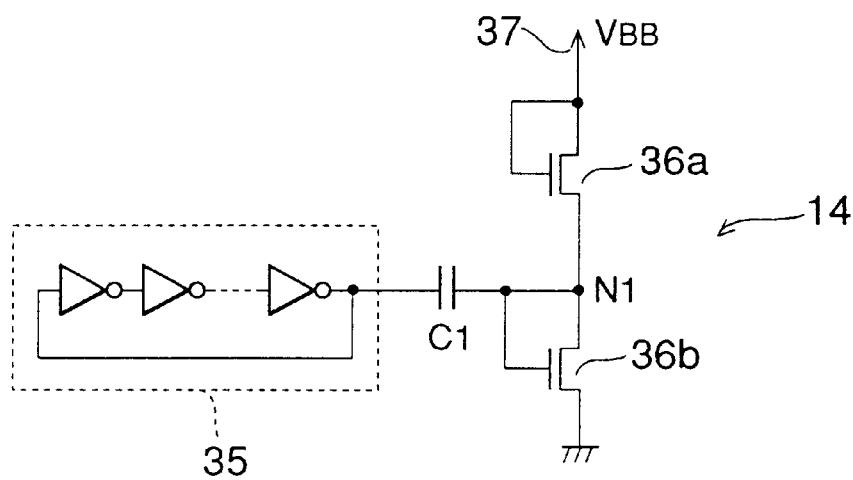
FIG. 4 is a circuit diagram of the low voltage generating circuit 14 shown in FIG. 1.

FIG. 4 shows a circuit diagram of the low voltage generating circuit 14, which includes a ring oscillator 35, a capacitor C1 and n type MOS transistors 36a and 36b. The ring oscillator 35 includes an odd number of inverters. The drain of the n type MOS transistor 36a is connected to the source of the n type MOS transistor 36b at a node N1. An output terminal of the ring oscillator 35 is connected to the node N1 and to the gate electrode of the n type MOS transistor 36b through the capacitor C1. The source of the n type MOS transistor 36a is connected to VBB, and the drain of the n type MOS transistor 36b is connected to GND. The source of the n type MOS transistor 36a is connected to its gate electrode, and the connecting point VBB is the output of the low voltage generating circuit 14. The threshold voltages of the n type MOS transistors 36a and 36b are each Vthn, which is lower than VDD.

A high level of an output voltage of the ring oscillator 35 is VDD. When the output voltage changes from the "L" level to "H" level (VDD), the n type MOS transistor 36a is in the OFF state. The potential of the node N1 becomes Vthn because the n type MOS transistor 36b changes to the ON state due to capacitive coupling of the capacitor C1. The capacitor C1 blocks direct current. Then, when the output of the ring oscillator 35 changes from the "H" level to the "L" level, ignoring parasitic capacitance, the potential of the node N1 changes to (Vthn−VDD) due to the capacitor coupling of capacitor C1. At this time, the n type MOS transistor 36a is in the ON state and the potential of the output terminal 37 becomes (Vthn−VDD)+Vthn=2 Vthn−VDD. On the other hand, the n type MOS transistor 36b is in the OFF state. Next, when the output of the ring oscillator 35 changes from the "L" level to the "H" level, the potential of the node N1 is electrically discharged until reaching Vthn. When the output of the ring oscillator 35 changes from the "HH" level to "L" level again, the potential of the node N1 becomes (Vthn−VDD), and the potential of the output terminal 37 similarly becomes (2 Vthn−VDD). The potential VBB at the output terminal 37 is stabilized by continuing this cycle and is lower than GND.

Figure 5:
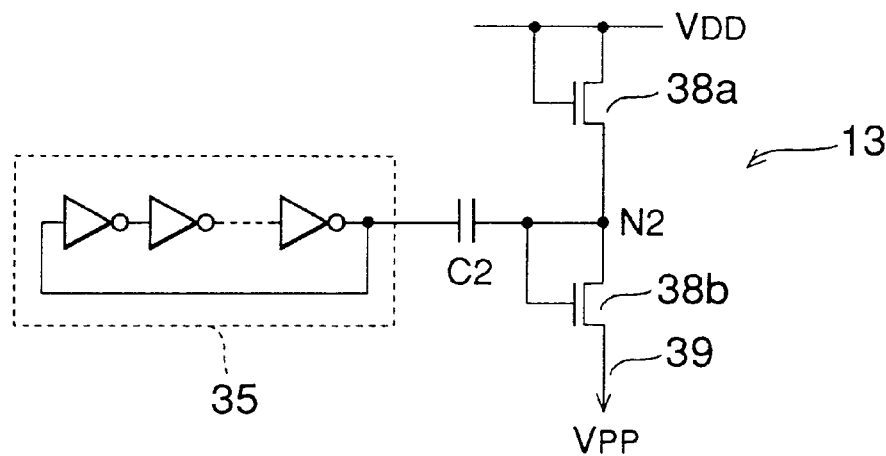
FIG. 5 is a circuit diagram of the high voltage generating circuit 13 shown in FIG. 1.

FIG. 5 is a circuit diagram of the high voltage generating circuit 13. The high voltage generating circuit 13 includes a ring oscillator 35, a capacitor C2 and n type MOS transistors 38a and 38b. The drain of the n type MOS transistor 38a and the terminal of the n type MOS transistor 38b are connected at a node N2. An output terminal of the ring oscillator 35 is connected to the node N2 and a gate electrode of the n type MOS transistor 38b through the capacitor C2. The source of the n type MOS transistor 38a is connected to VDD and the drain of the n type MOS transistor 38b is connected to VPP at an output terminal 39. The threshold voltages of the n type MOS transistors 38a and 38b are each Vthn, where Vthn is lower than VDD.

A high level of an output voltage of the ring oscillator 35 is VDD. When the output voltage changes from the "HH" level to the "L" level (GND), the n type MOS transistor 38b is in the OFF state. The potential of the node N2 then becomes (VDD−Vthn). Next, when the output of the ring oscillator 35 changes from the "L" level to the "H" level, the potential of the node N2 becomes (VDD−Vthn)+VDD=2 VDD−Vthn, the n type MOS transistor 38b is in the ON state, and the n type MOS transistor 38a is in the OFF state. Therefore, the potential of the output terminal 39 becomes (2 VDD−Vthn)−Vthn=2(VDD−Vthn). The potential VPP of the output terminal 39 is stabilized by continuing this cycle. This potential VPP, which is greater than VDD, is outputted from the output terminal 39.

In FIG. 4, the high voltage generating circuit 13 and the low voltage generating circuit 14 generate VBB=2 Vthn−VDD and VPP=2(VDD−Vthn), respectively. Further, if a plurality of diode connected n type MOS transistors are connected to the output terminal 37, it is possible to produce a VBB which is smaller than GND and greater than (2 Vthn−VDD) from the final output terminal of the n type MOS transistors. In FIG. 5, if a plurality of diode connected n type MOS transistors are connected to the output terminal 39, it is possible to produce a voltage VPP which is smaller than 2(VDD−Vthn) and is greater than VDD from the final output terminal of the n type MOS transistors.

Figure 6:
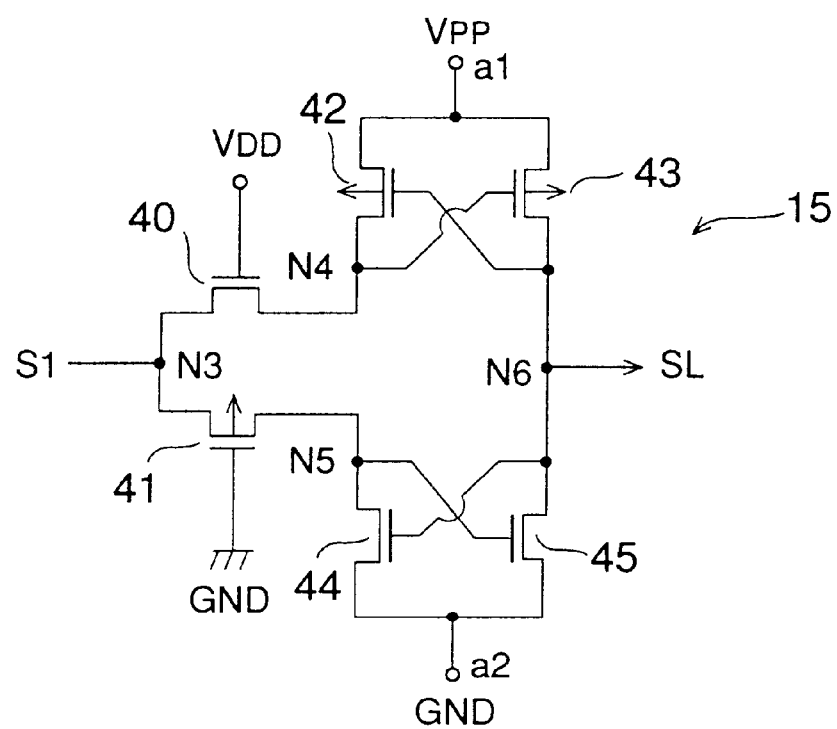
FIG. 6 is a circuit diagram of the selecting circuit 15 shown in FIG. 1.

FIG. 6 is a circuit diagram of the selecting circuit 15. The selecting circuit 15 includes n type MOS transistors 40, 44 and 45, and p type MOS transistors 41, 42 and 43. VDD is supplied to a gate electrode of the n type MOS transistor 40. GND is supplied to a gate electrode of the p type MOS transistor 41. The source of the n type MOS transistor 40 is connected to the drain of the p type MOS transistor 41 at a node N3. The source of the p type MOS transistor 42 is connected to the source of the p type MOS transistor 43 at a node a1. VPP is supplied to the node a1. The gate electrode of the p type MOS transistor 42 is connected to the drain of the p type MOS transistor 43 at a node N6. The signal line SL is connected to the node N6. The drain of the p type MOS transistor 42 is connected to the gate electrode of the p type MOS transistor 43 at the node N4. The source of the n type MOS transistor 44 is connected to the source of the n type MOS transistor 45 at a node a2. GND is supplied to the node a2. The drain of the n type MOS transistor 44 is connected to the gate electrode of the n type MOS transistor 45 at a node N5. The gate electrode of the n type MOS transistor 44 is connected to the drain of the n type MOS transistor 45 at the node N6. The signal line S1 is connected to the node N3. The threshold voltage of each of the n type MOS transistors 40, 44 and 45 is Vthn. The threshold voltage of each of the p type MOS transistors 41, 42 and 43 is Vthp(=−Vthn).

The following discussion explains operation of the selecting circuit 15. When the signal line S1 is VDD (active state), the potential at node N4 is charged to (VDD−Vthn) and the potential at node N5 is charged to VDD. Therefore, the voltage between the source and drain of the p type MOS transistor 43 is −(VPP−(VDD−Vthn))=Vthn−VDD, and the voltage between the source and the drain of the n type MOS transistor 45 is VDD. As the ON state of the p type MOS transistor 43 is inferior to that of the n type MOS transistor 45, the ON state of the p type MOS transistor 43 is weaker and the ON state of the n type MOS transistor 45 is stronger because the p type MOS transistor 43 is connected to the p type MOS transistor 42 and the n type MOS transistor 45 is connected to the n type MOS transistor 44. Finally, the potential of the node N6 becomes GND.

When the signal line S1 is GND (standby state), the potential at the node N4 is GND and the potential at the node N5 is −Vthp. Therefore, the potential between the source and drain of the p type MOS transistor 43 is −(VPP−GND)=−VPP=2 Vthn−2 VDD and that of the n type MOS transistor 45 is −Vthp=Vthn. As the ON state of the p type MOS transistor 43 is superior to that of the n type MOS transistor 45, the ON state of the p type MOS transistor 43 is stronger and the ON state of the n type MOS transistor 45 is weaker because the p type MOS transistor 43 is connected to the p type MOS transistor 42 and the n type MOS transistor 45 is connected to the n type MOS transistor 44. Finally, the potential of the node N6 becomes VPP. The potential of the node N6 is the output signal from the selecting circuit 15.

Figure 7:
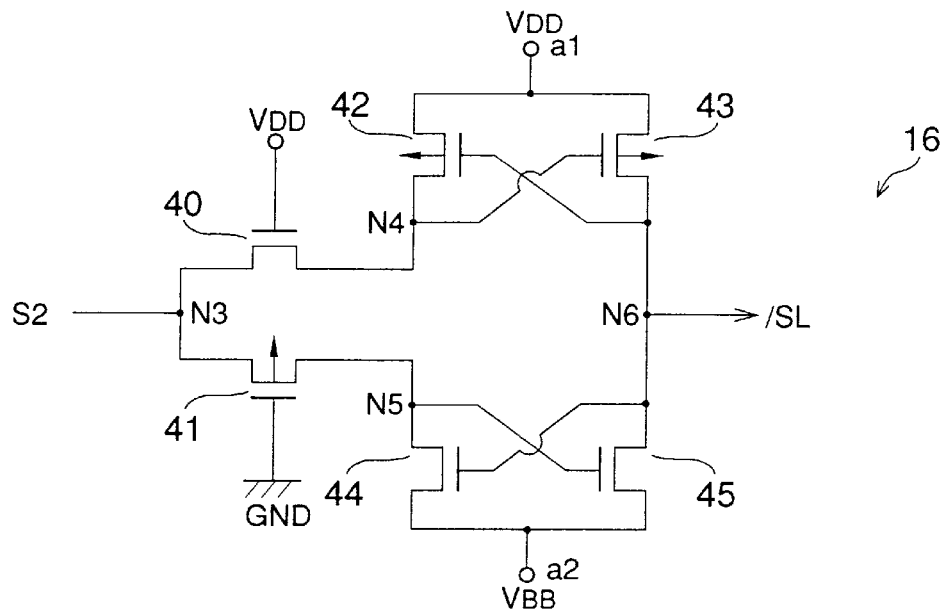
FIG. 7 is a circuit diagram of the selecting circuit 16 shown in FIG. 1.

FIG. 7 is a circuit diagram of the selecting circuit 16. The circuit elements are almost the same as that of the selecting circuit 15. However, in FIG. 7, VDD is supplied to the node a1, and VBB is supplied to node a2, the signal line S2 is connected to the node N3, and the signal line $\overline{SL}$ is connected to the node N6.

Operation of selecting circuit 16 is basically the same as that of the selecting circuit 15. When the signal line 52 is GND (active state), VDD which is supplied to the node a1 is outputted from the node N6. When the signal line S2 is VDD (standby state), VBB which is supplied to the node a2 is outputted from the node N6. The potential at the node N6 is the output signal from the selecting circuit 16.

Moreover, the n type MOS transistor 40 and the p type MOS transistor 41 function to isolate the potential at the node N4 from the potential at the node N5 until the states of the crossed circuits (the p type MOS transistors 42 and 43, and n type MOS transistors 44 and 45) are definite at start-up.

In this embodiment, VPP and VBB are 2 VDD−2 Vthn, 2 Vthn−VDD, respectively. In the design of the semiconductor integrated circuits, various factors, in addition to the threshold voltages of the p type MOS transistor Q1 and the n type MOS transistor Q2, are considered in the reduction of leakage current, such as, for example, the power supply voltage (VDD), the reliability of the MOS transistor, the transistor scale and the required performance of the finished product including the logic circuit 11. In this case, VPP and VBB are determined and established by change in the designs of the high voltage generating circuit 13 and the low voltage generating circuit 14, respectively.

Although this embodiment has been described with reference to the use of CMOS technology, other technologies such as, for example, bipolar transistor technology, may be used with the same effect as described above. Further, an analog circuit having an active state and a standby state may be used instead of the logic circuit 11 to provide the same effect as described above.

(Second Embodiment)

Figure 8:
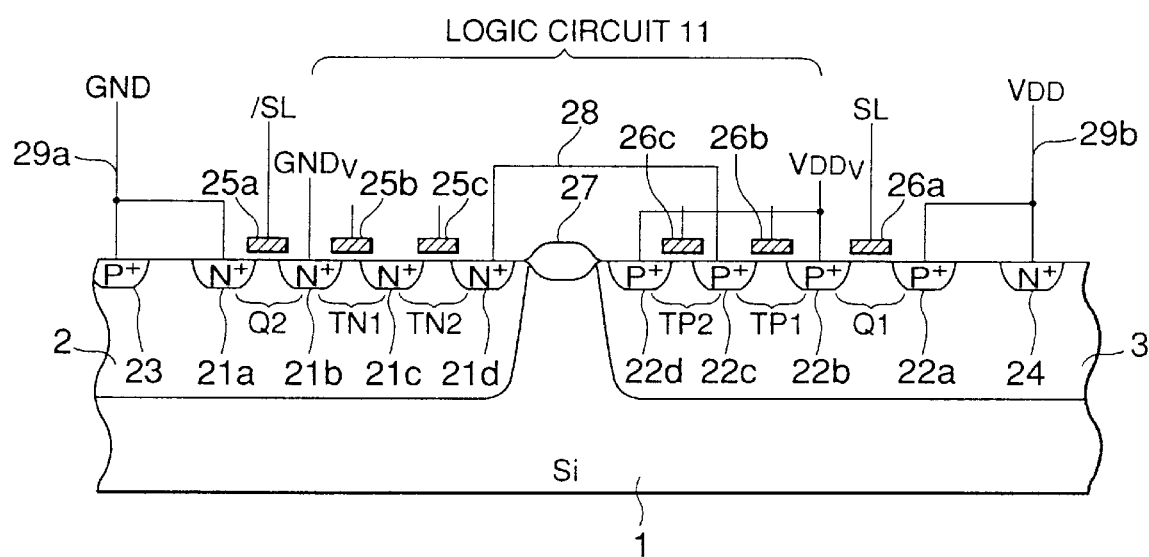
FIG. 8 is a sectional view of a second embodiment of the logic circuit 11 as shown in FIG. 1.

FIG. 8 is a sectional view of the logic circuit 11 of a second embodiment of the present invention. The structure of FIG. 8 does not have the ion implanted regions 30 and 31 of FIG. 2, but otherwise has the same structure as that of FIG. 2. In FIG. 8, the n type semiconductor regions 21a–21d are formed in the p type well 2 at the same time by ion implantation. The p type semiconductor regions 22a–22d are formed in the n type well 3 at the same time by ion implantation. The gate electrodes 25a–25c, 26a–26c are formed at the same time by the same process. The insulating layers(not shown) under each gate electrodes 25a–25c, 26a–26c are formed at the same time by the same process.

The material and the profile of the impurity concentration of the impurity regions serving as the source and drain regions of the n type MOS transistors are the same. The material and the profile of the impurity concentration of the impurity regions serving as the source and drain regions of the p type MOS transistors in the n type well 3 are same. The channel regions in the p type well 2 are formed of the same material and have the same impurity concentration profile. The channel regions in the n type well 3 are formed of the same material and have the same impurity concentration profile. The gate electrodes and the insulating layers are each formed of the same material and with the same film thickness.

Although the n type MOS transistors in the p type well 2 are designed to have the same threshold voltage, as a matter of fact, the threshold voltages typically are within a range of 0.2 V–0.3 V after manufacture. Similarly, ideally the p type MOS transistors in the n type well 3 have the same threshold voltage, but as a matter of fact have threshold voltages in the range −0.2 V––0.3 V after manufacture.

In FIG. 8, the gate electrode 25a and the gate electrode 26a are connected to the signal line SL and the signal line $\overline{SL}$, respectively. As FIG. 3 shows, when the logic circuit 11 is in the active state, the MOS transistors Q1 and Q2 are in the ON state because the level of the signal line SL is GND and the level of the signal line $\overline{SL}$ is VDD. On th other hand, when the logic circuit 11 is in the standby state, the MOS transistors Q1 and Q2 are in the OFF state because the level of the signal line SL is VPP and the level of the signal line $\overline{SL}$ is VBB.

In the embodiment of FIG. 8, the semiconductor integrated circuit is simply formed because it does not need the doping process for forming the regions 30 and 31, and this embodiment does not need separate processing to make the MOS transistors(Q1, Q2) and regions 30, 31, insofar as the MOS transistors (Q1, Q2) are formed at the same time on the same semiconductor integrated circuit having the logic circuit 11. The FIG. 8 embodiment also prevents increase in the leakage current, because the gate electrode of the p type MOS transistor Q1 is supplied with VPP and the gate electrode to the n type MOS transistor Q2 is supplied with VBB. Therefore, the productivity and yield of the semiconductor integrated circuit is improved.

Figure 20:
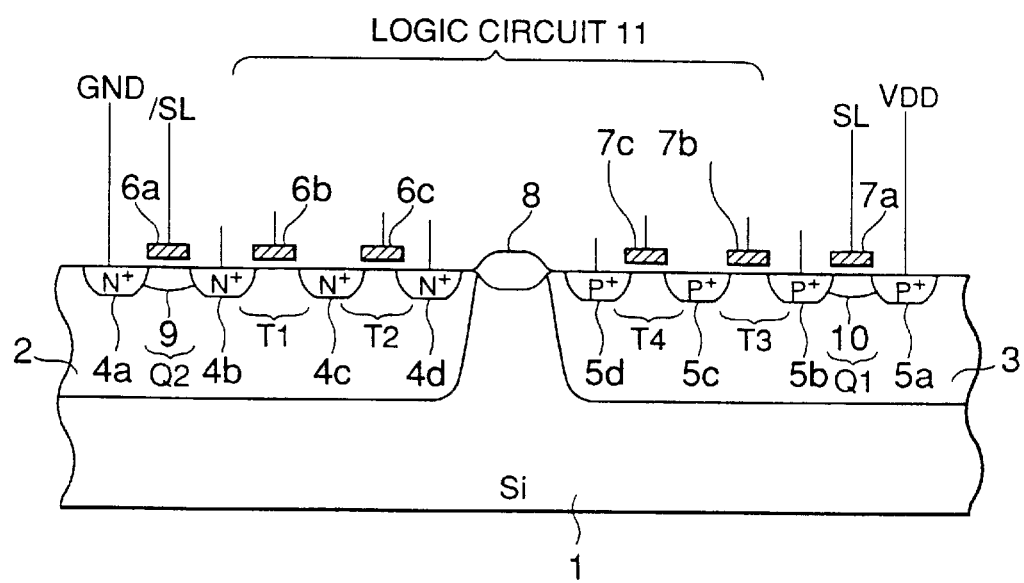
FIG. 20 is a section view of a semiconductor chip to realize the conventional CMOS transistor circuits of FIG. 19.

Moreover, the logic circuit 11 is implemented with a high speed capability, in that the ability to supply current to the logic circuit 11 is improved, because the threshold voltages (absolute value) of the p type MOS transistor Q1 and that of the n type MOS transistor Q2 are smaller than that of FIG. 20.

(Third embodiment)

Figure 9:
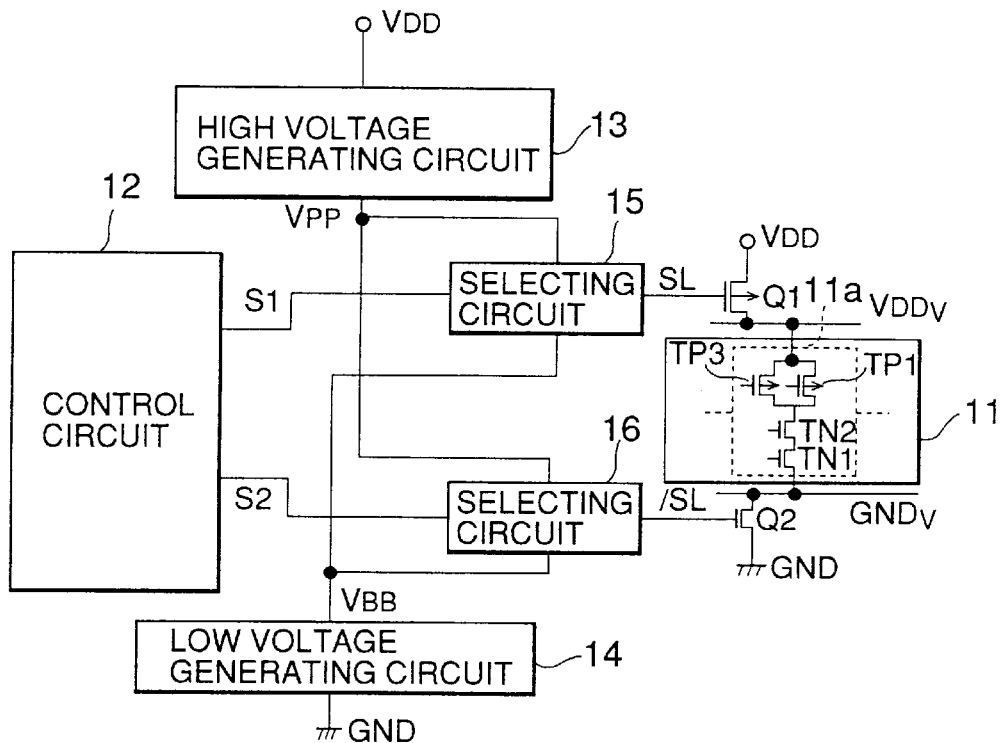
FIG. 9 is a circuit diagram of a third embodiment of the semiconductor integrated circuit of the present invention.

FIG. 9 is a circuit diagram of a third embodiment of the present invention. In FIG. 9, VBB from the low voltage generating circuit 14 is supplied to the selecting circuit 15, VPP from the high voltage generating circuit 13 is supplied to the selecting circuit 16, the node a2 of the selecting circuit 15 is connected to VBB, and the node a1 of the selecting circuit 16 is connected to VPP. The remaining structure is the same structure shown in FIG. 1.

Figure 10:
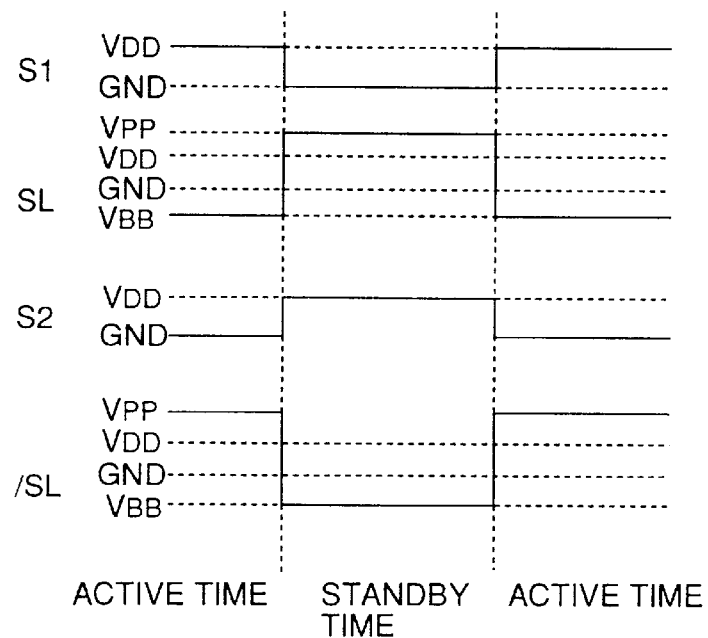
FIG. 10 is a timing diagram of signals indicating operation of the semiconductor integrated circuit of FIG. 9.

FIG. 10 is a timing diagram of the operation of the semiconductor integrated circuit shown in FIG. 9, in which signals on the signal lines S1, S2, SL and $\overline{SL}$ are shown. When the logic circuit 11 is in the active state, the level of the signal line SL is VBB and the level of the signal line $\overline{SL}$ is VPP. When the logic circuit 11 is in the standby state, the level of the signal line SL is VPP and the level of the signal line $\overline{SL}$ is VBB.

In this embodiment, VBB, which is lower than GND, is supplied to the gate electrode of the p type MOS transistor Q1 and VPP, which is greater than VDD, is supplied to the gate electrode of the n type MOS transistor Q2. It is known that the n type MOS transistor Q2 operates in the linear region when a large voltage is supplied to the gate electrode. And, the channel conductance is proportional to (VGS−Vthn). Therefore, in the active state, for example, if each voltage threshold is Vthn =0.4 V, VGS=VPP=2.5 V in this embodiment, whereas when each threshold voltage in Vthn= 0.4 V in the preceding embodiment, VGS=VDD=1.5 V. As a result, the channel conductance of the embodiment of FIG. 10 is about twice that of the preceding embodiment. As the channel conductance increases, the impedance of GNDV decreases. In the p type MOS transistor Q1, as the voltage which is supplied to the gate electrode is lower than GND, the channel conductance increases. The impedance of VDDV decreases. Therefore, the necessary time to charge and discharge each node in the logic circuit 11 is reduced and the logic circuit 11 operates with high speed in addition to having decreased leakage current.

Furthermore, in the FIG. 10 embodiment, the level of the signal line SL is VBB and the level of the signal line $\overline{SL}$ is VPP when in the active state, while when in the standby state, the level of the signal line SL is VDD and the level of the signal line $\overline{SL}$ is GND. To design this circuit, the node a1 is supplied with GND and the node a2 is supplied with VBB in the selecting circuit 15. In the selecting circuit 16, the node a1 is supplied with VPP and the node a2 is supplied with GND. In this case, high performance is further enhanced, as may be desired for a particular application or due to a particular design specification for the logic circuit 11.

(fourth embodiment)

Figure 11:
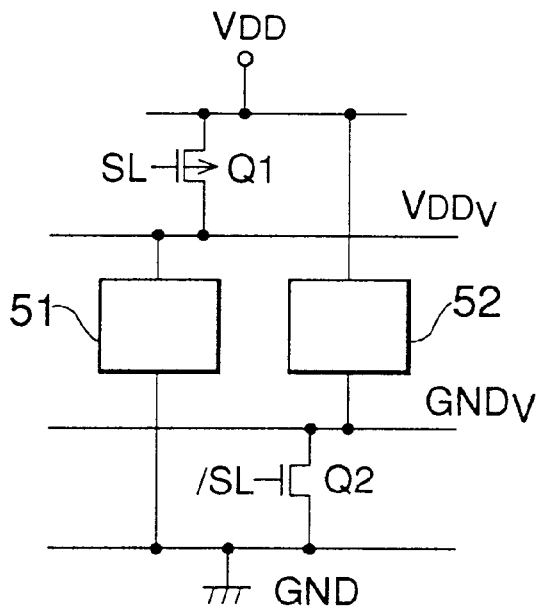
FIG. 11 is a circuit diagram of a fourth embodiment of a semiconductor integrated circuit of the present invention.

FIG. 11 is a circuit diagram of a semiconductor integrated circuit of a fourth embodiment of the present invention. In this embodiment, a logic circuit 51 is connected to VDDV and GND. The potentials of VDDV and GND serve as a power supply input to the logic circuit 51. A logic circuit 52 is connected to VDD and GNDV. The potentials of VDD and GNDV serve as a power supply input to the logic circuit 52. The other portions of FIG. 11 are the same as in FIG. 1.

In the embodiment of FIG. 11, the logic circuits 51 and 52 are controlled by one of respective signal lines (SL or $\overline{SL}$). The logic circuit 51 is connected directly to GND and the logic circuit 52 is connected directly to VDD. The selection of an active state or a standby state of the logic circuit 51 is controlled by controlling the ON or OFF state of the p type MOS transistor Q1. The selection of an active state or a standby state of the logic circuit 52 is controlled by controlling the ON or OFF state of the n type MOS transistor Q2. This structure may be adopted in view of various factors in the process of manufacturing the semiconductor integrated circuit.

Figure 12:
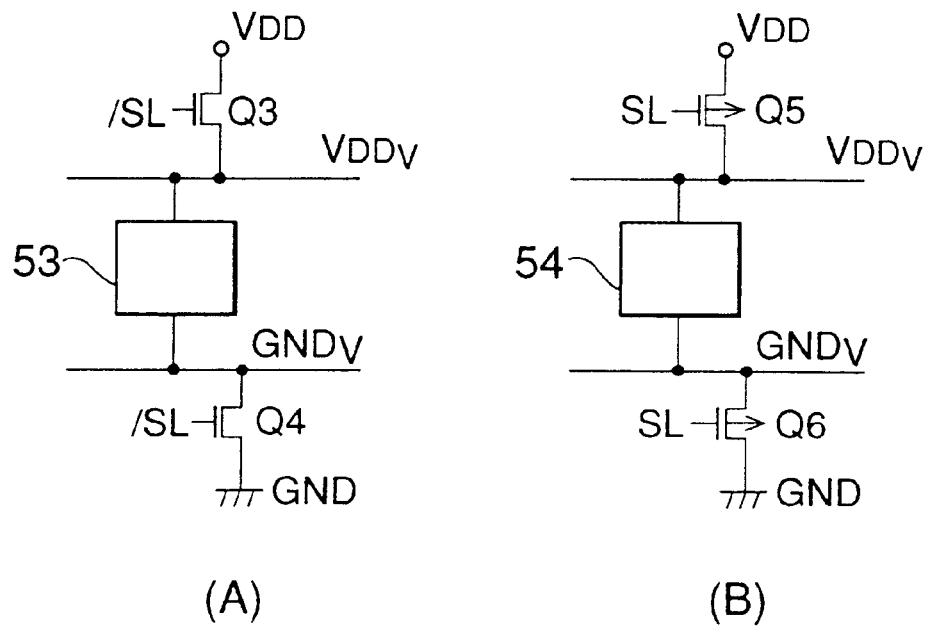
FIGS. 12(A) and 12(B) are alternative circuit diagrams of the semiconductor integrated circuit of the fourth embodiment.

FIGS. 12(A), 12(B) show another a circuit diagram of this embodiment. In FIG. 12(A), a logic circuit 53 is connected to an n type MOS transistor Q3 through VDDV and an n type MOS transistor Q4 through GNDV respectively. The gate of the n type MOS transistor Q3 is connected to the signal line $\overline{SL}$. The gate of the n type MOS transistor Q4 is connected to the signal line $\overline{SL}$. The source of the n type MOS transistor Q3 is connected to VDD. The source of the n type MOS transistor Q4 is connected to GND. These n type MOS transistors Q3 and Q4 are controlled by the level of the signal line $\overline{SL}$. When $\overline{SL}$ is "H" level (the active state), the logic circuit 53 is supplied with VDD and GND. When $\overline{SL}$ is "L" level (the standby state), the logic circuit 53 is supplied with (2 Vthn−VDD) from GNDV.

In FIG. 12(B), a logic circuit 54 is connected to a p type MOS transistor Q5 through VDDV and an n type MOS transistor Q6 through GNDV, respectively. The gate of the p type MOS transistor Q5 is connected to the signal line SL and the gate of the p type MOS transistor Q6 is connected to the signal line SL. The source of the p type MOS transistor Q5 is connected to VDD. The source of the p type MOS transistor Q6 is connected to GND.

The p type MOS transistors Q5 and Q6 are controlled by the level of the signal line SL. When SL is "L" level (the active state), the logic circuit 54 is supplied with VDD and GND. When SL is "H" level (the standby state), the logic circuit 54 is supplied with (2 VDD−2 Vthn) from VDDV. These structures may be adopted in view of various factors in the process of manufacturing the semiconductor integrated circuit. It may otherwise be structured that the n type MOS transistor Q3 is removed and the logic circuit 53 is connected directly to VDD as shown in FIG. 12(A). It may also otherwise be structured that the p type MOS transistor Q6 is removed and the logic circuit 54 is connected directly to GND as shown in FIG. 12(B).

(fifth embodiment)

Figure 13:
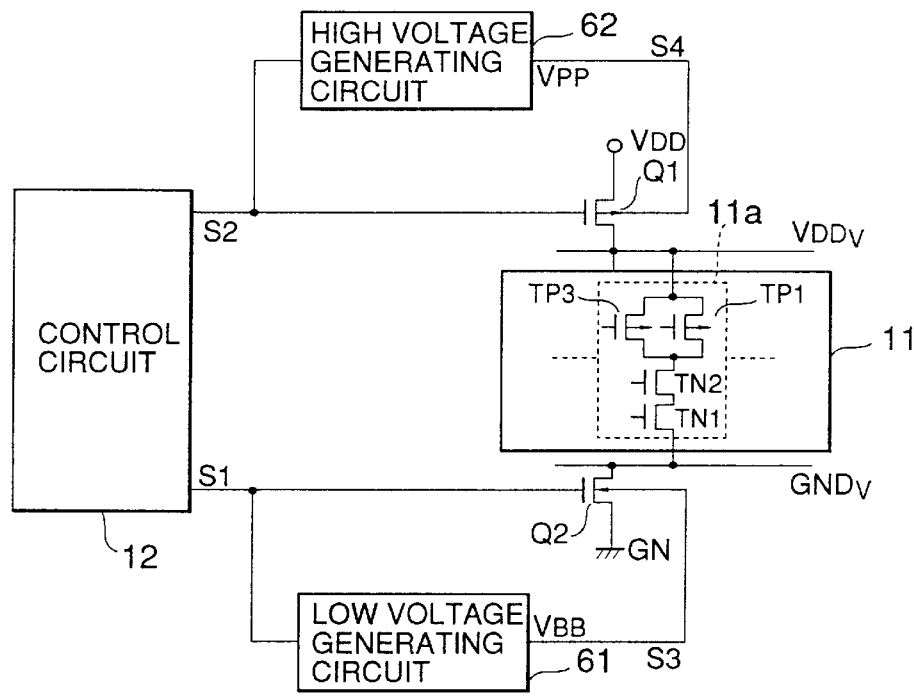
FIG. 13 is a circuit diagram of a fifth embodiment of a semiconductor integrated circuit of the present invention.

FIG. 13 is a circuit diagram of a semiconductor integrated circuit according to a fifth embodiment of the present invention. The semiconductor integrated circuit includes a logic circuit 11, a control circuit 12, a low voltage generating circuit 61, a high voltage generating circuit 62, the p type MOS transistor Q1, the n type MOS transistor Q2, VDDV and GNDV. The low voltage generating circuit 61 generates VBB and selects GND or VBB in accordance with a level of signal S1. The selected voltage(GND or VBB) is supplied to a backgate of the n type MOS transistor Q2. The high voltage generating circuit 62 generates VPP and selects VPP or VDD in accordance with a level of signal S2. The selected voltage (VPP or VDD) is supplied to a backgate of the p type MOS transistor Q1. The low voltage generating circuit 61 is connected to the n type MOS transistor Q2 by a signal line S3. The high voltage generating circuit 62 is connected to the p type MOS transistor Q1 by a signal line S4. The control circuit 12 is connected to the gate of the p type MOS transistor Q1 by the signal line S2 and is connected to the gate of the n type MOS transistor Q2 by the signal line S1.

Figure 14:
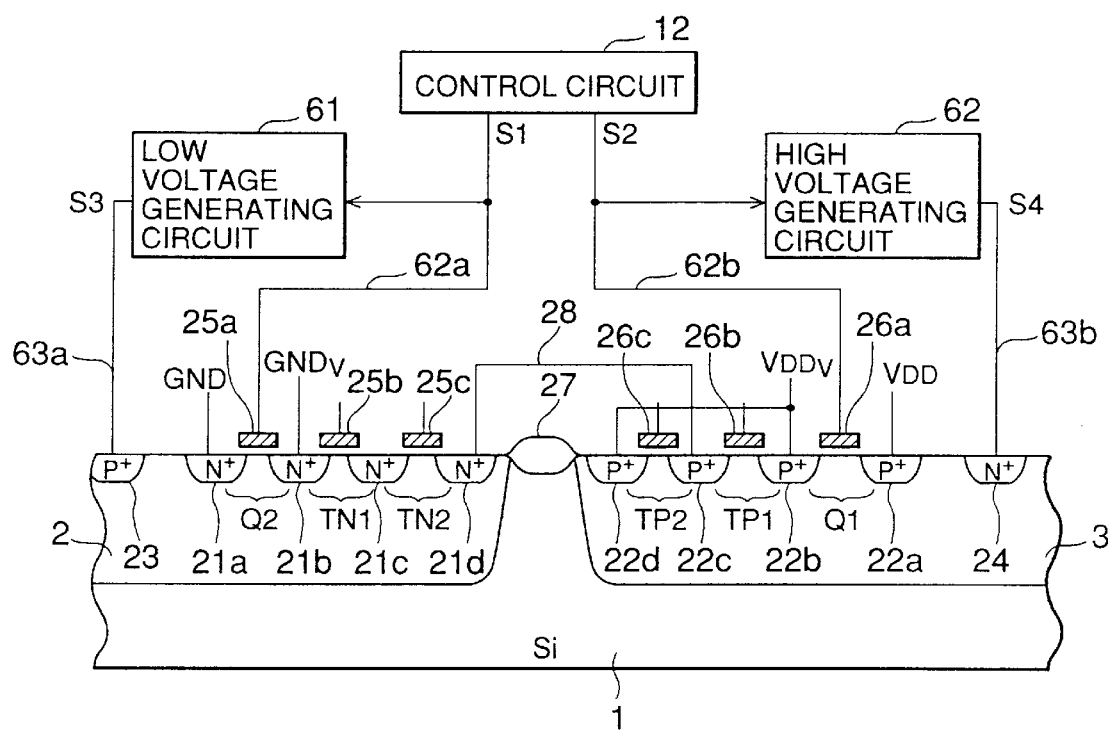
FIG. 14 is a sectional view of the semiconductor integrated circuit of FIG. 13.

FIG. 14 is a schematic illustration, partly in cross-section, of the semiconductor integrated circuit of FIG. 13.

The semiconductor integrated circuit is implemented in CMOS technology. A wire 62a is the signal line S1. A wire 62b is the signal line S2. A wire 63a is the signal line S3. A wire 63b is the signal line S4. The wire 62a is connected to the control circuit 12 and the gate electrode 25a. The wire 62b is connected to the control circuit 12 and the gate electrode 26a. The wire 63a is connected to the p type region 23. The wire 63b is connected to the n type region 24. The other portions shown in FIG. 14 are the same as that of FIG. 8. Typically, the control circuit 12, the low voltage generating circuit 61 and the high voltage generating circuit 62 are also formed on the semiconductor integrated circuit.

The n MOS transistors in the p type well 2 are formed by the same process at the same time. The p type MOS transistors in the n type well 3 are formed by the same process at the same time. The threshold voltage of the n type MOS transistors in the p type well 2 is 0.2–0.3 V. The threshold voltage of the p type MOS transistors in the n type well 3 is −0.2−−0.3 V.

Figure 15:
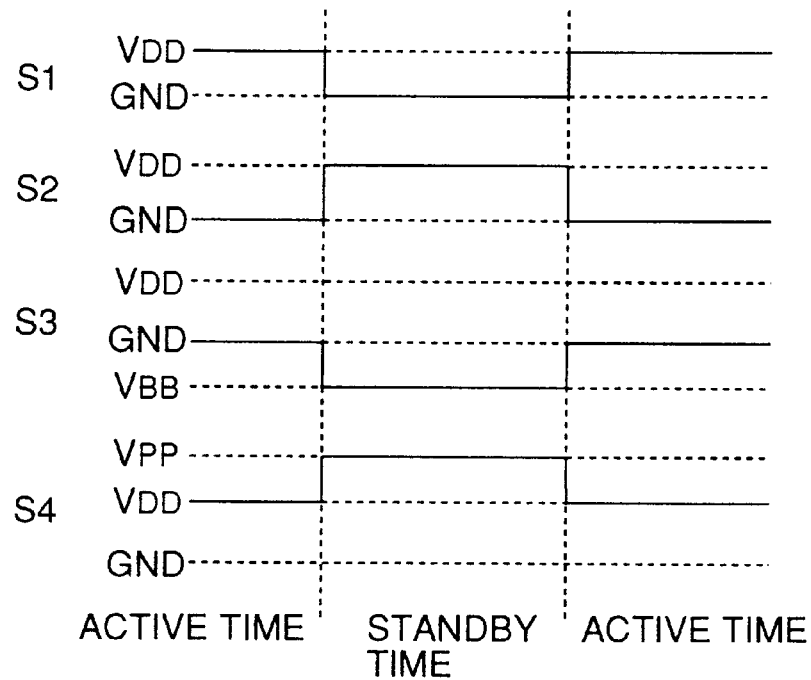
FIG. 15 is a timing diagram of signals indicating operation of the semiconductor integrated circuit of FIG. 13.

The following is an explanation of the operation of the semiconductor integrated circuit of FIG. 14. FIG. 15 is a timing diagram of the operation of this semiconductor integrated circuit and illustrates the signals on signal line S1–S4. When the logic circuit 11 is in the active state, the signal line S1 is "H" level (VDD). When the logic circuit 11 is in the standby state, the signal line S1 is "L" level (GND). The low voltage generating circuit 61 outputs a signal according to the level of the signal line S1. When the signal line S1 is "H" level (VDD), the low voltage generating circuit 61 outputs GND to the signal line S3. When the signal line S1 is "L" level (GND), the low voltage generating circuit 61 outputs VBB to the signal line S3. The voltage level of the signal line S3 is the backgate voltage applied to each n type MOS transistor in the p type well 2, because the signal line S3 is connected to the whole region of the p type well 2 through the p type region 23. The high voltage generating circuit 62 outputs a signal according to the level of the signal line S2. When the signal line S2 is "L" level (GND), the high voltage generating circuit 62 outputs VDD to the signal line S4. When the signal line S2 is "H" level (VDD), the high voltage generating circuit 62 outputs VPP to the signal line S4. The voltage level of the signal line S4 is the backgate voltage applied to each p type MOS transistor in the n type well 3, because the level of the signal line S4 is supplied to the entire n type well 3 through the n type region 24.

When the logic circuit 11 is in the active state, the gate voltage applied to the p type MOS transistor Q1 is GND and its backgate voltage is VDD according to the levels of the signal lines S2 and S4. When the logic circuit 11 is in the standby state, the gate voltage is VDD and the backgate voltage is VPP, according to the levels of the signal lines S2 and S4. When the logic circuit 11 is in the active state, the gate voltage applied to the n type MOS transistor Q2 is VDD and its backgate voltage is GND according to the levels of the signal lines S1 and S3. When the logic circuit 11 is in the standby state, the gate voltage is GND and the backgate voltage is VBB according to the signal lines S1 and S3.

When the p type MOS transistor Q1 is supplied with VDD as the backgate voltage, its threshold voltage is −0.2−−0.3 V. When the n type MOS transistor Q2 is supplied with GND as the backgate voltage, its threshold voltage is 0.2–0.3. When the backgate voltage of Q1 is VPP, its threshold voltage is small. Similarly, when the backgate voltage of the n type MOS transistor Q2 is VBB, its threshold voltage is large. Therefore, the semiconductor integrated circuit exhibits low input power consumption, because the leakage current of the p type MOS transistor Q1 and that of the n type MOS transistor Q2 is reduced when in the standby state.

Figure 16:
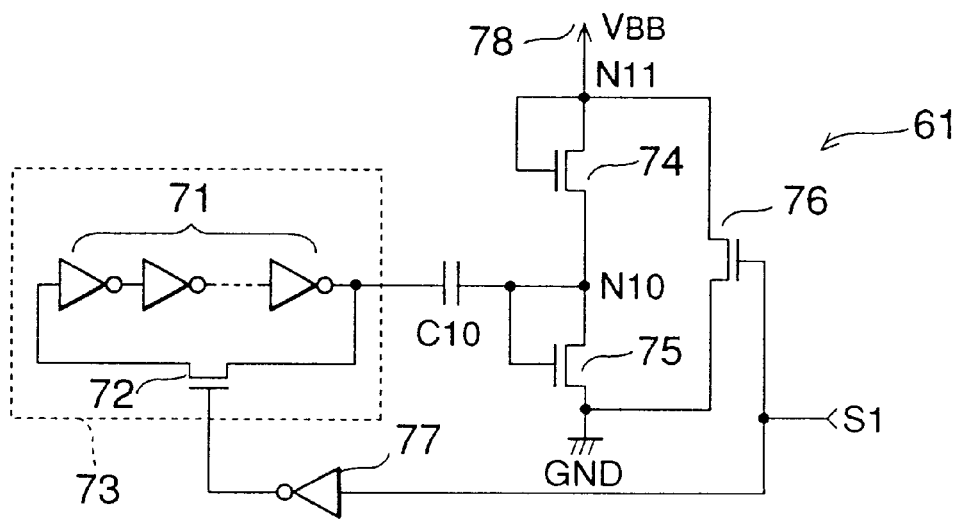
FIG. 16 shows a circuit diagram of the low voltage generating circuit 61 of FIG. 13.

FIG. 16 is a circuit diagram of the low voltage generating circuit 61. The low voltage generating circuit 61 includes a ring oscillator 73, a plurality of n type MOS transistors 74, 75, 76, a capacity C10 and an inverter 77. The ring oscillator 73 includes an odd number of inverters 71 and an n type MOS transistor 72. The n type MOS transistor 72 is controlled by a signal from the inverter 77. The n MOS transistor 74 is connected to the n type MOS transistor 75 at a node N10. Transistors 74 and 75 each have threshold voltage Vthn which is a smaller than VDD. The source of the n type MOS transistor 75 is connected to GND and its gate electrode is connected to the node N10. The drain of the n type MOS transistor 74 is connected to the gate electrode at the node N11. The n type MOS transistor 76 is connected to the node N11 and GND. The output terminal of the ring oscillator 73 is connected to the node N10 through the capacitor C10. The signal line S1 is connected to the gate electrode of the n type MOS transistor 76 and to the inverter 77. The node N11 is an output terminal 78 for outputting VBB as the output signal from the low voltage generating circuit 61.

The following is an explanation of the operation of the low voltage generating circuit 61. When the signal line S1 is "L" level (GND), the gate electrode of the n type MOS transistor 76 is supplied with the "L" level and the gate electrode of the n type MOS transistor 72 is supplied with the "H" level through the inverter 77. VBB is outputted from the output terminal 78 according to the levels of the ring oscillator 73, the capacitor C10 and the n type MOS transistors 74, 75 because the n type MOS transistor 76 is in the "OFF" state and the n type MOS transistor 72 is in the "ON" state. The generation of VBB is above explained in relation to FIG. 4, and therefore the description thereof is omitted.

When the signal line S1 is "H" level (VDD), the gate electrode of the n type MOS transistor 72 is supplied with the "L" level through the inverter 77, the n type MOS transistor 72 is in the "OFF" state, and the operation of the ring oscillator 73 stops. The gate electrode of the n type MOS transistor 76 is in the "ON" state and GND is outputted from the output terminal 78, because the gate electrode of the n type MOS transistor 76 is supplied with the "H" level. Consequently, as show in FIG. 15 (signal line S3), the low voltage circuit 61 outputs GND when the logic circuit 11 is in the active state and outputs VBB when the logic circuit 11 is in the standby state.

Figure 17:
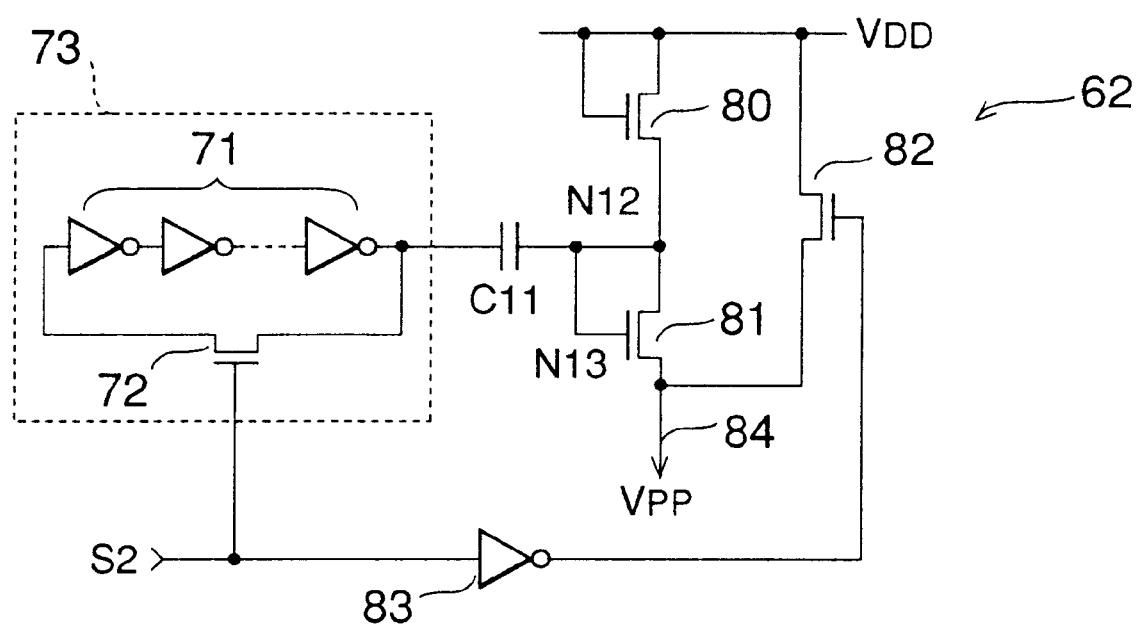
FIG. 17 shows a circuit diagram of the high voltage generating circuit 62 of FIG. 13.

FIG. 17 is a circuit diagram of the high voltage generating circuit 62. The high voltage generating circuit 62 includes the ring oscillator 73, a plurality of n type MOS transistors 80, 81, 82, a capacitor C11 and an inverter 83. The ring oscillator 73 includes an odd number of inverters 71 and the n type MOS transistor 72. The n type MOS transistor 72 is controlled by the signal S2. The n MOS transistor 80 is connected to the n type MOS transistor 81 at a node N12. Transistors 80 and 81 each have a threshold voltage Vthn which is a smaller than VDD. The drain of the n type MOS transistor 80 is connected to VDD and its gate electrode is connected to VDD. The drain of the n type MOS transistor 81 is connected to its gate electrode at the node N12. The n type MOS transistor 82 is connected to the node N13 and VDD. The output terminal of the ring oscillator 73 is connected to the node N12 through the capacitor C11. The signal line S2 is connected to the gate electrode of the n type MOS transistor 72 and to an input of the inverter 83. The node N13 is an output terminal 84 for outputting VPP as the output signal from the high voltage generating circuit 62.

The following is an explanation of the an operation of the high voltage generating circuit 62. When the signal line S2 is "H" level (VDD), the gate electrode of the n type MOS transistor 72 is supplied with the "H" level and the gate electrode of the n type MOS transistor 82 is supplied with the "L" level through the inverter 83. VPP is outputted from the output terminal 84 according to the levels of the ring oscillator 73, the capacitor C11 and n type MOS transistors 80,81 because the n type MOS transistor 82 is in the "OFF" state and the n type MOS transistor 72 is in the "ON" state. The generation of VPP is above explained in relation to FIG. 5, and therefore the description thereof is omitted.

When the signal line S2 is "L" level (GND), the gate electrode of the n type MOS transistor 72 is supplied with the "L" level, the n type MOS transistor 72 is in the "OFF" state, and the operation of the ring oscillator 73 stops. The gate electrode of the n type MOS transistor 82 is in the "ON" state and VDD is outputted from the output terminal 84, because the gate electrode of the n type MOS transistor 82 is supplied with the "H" level through the inverter 83. Consequently, as show in FIG. 15, the high voltage circuit 62 outputs VDD when the logic circuit 11 is in the active state and outputs VPP when the logic circuit 11 is in the standby state.

The input power consumption of the ring oscillator 73 decreases, because the n type MOS transistor 72 stops the operation of the ring oscillator 73 when the logic circuit 11 is the active state. When the logic circuit 11 changes from the standby state to the active state, the level of the output terminal 78 can quickly change from VBB to GND according to the switching operation of the n type MOS transistor 76 based on the signal line S1. Also, the n type MOS transistor 82 in FIG. 17 performs the same function as that of the n type MOS transistor 76 shown in FIG. 16.

As a variation of the Fifth embodiment shown in FIG. 14 designed to enhance performance of the semiconductor integrated circuit when in the active state, a backgate voltage higher than GND is applied to the backgate of the n type MOS transistor Q2 and a backgate voltage lower than VDD is applied to the backgate of the p type MOS transistor Q1, and the threshold voltage of the n type MOS transistor Q2 is set low (e.g., the same as that of TN1, Tn2) and the threshold voltage of the p type MOS transistor Q1 is set high (e.g., such as by ion implantation as shown in FIG. 1). In this case, the low voltage generating circuit 61 outputs a backgate voltage of (2 Vthn−VDD) that is higher than GND. The high voltage generating circuit 62 outputs a backgate voltage of 2(VDD−Vthn) that is lower than VDD. These backgate voltages are supplied to the p type well 2 and the n type well 3, respectively. Therefore, the semiconductor integrated circuit exhibits both high performance in the active state and decreased leakage current in the standby state.

(sixth embodiment)

Figure 18:
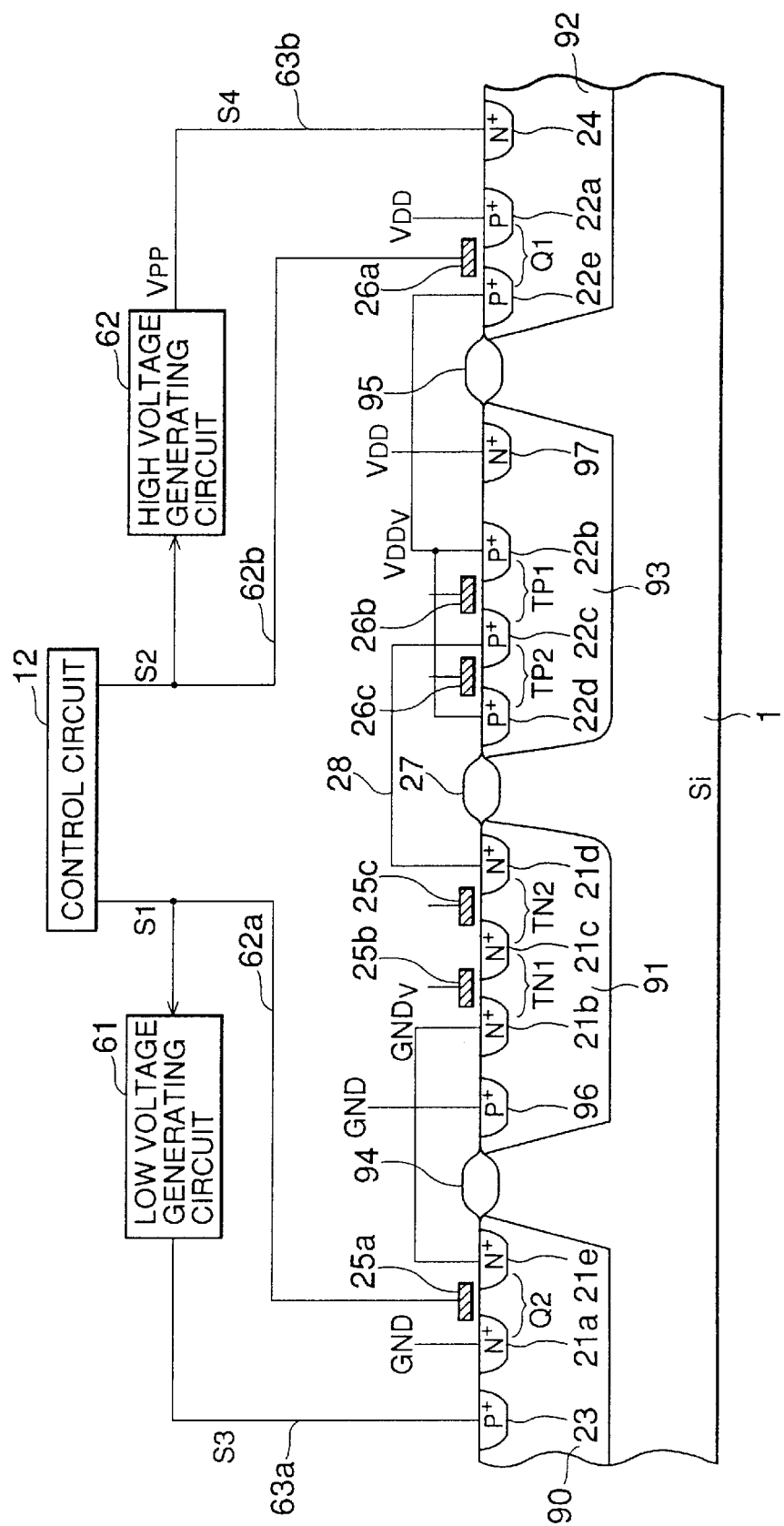
FIG. 18 is a sectional view of a sixth embodiment of the semiconductor integrated circuit of the present invention.
Figure 19:
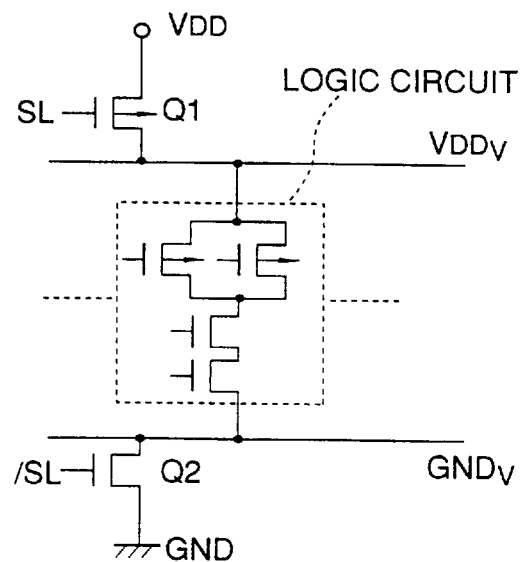
FIG. 19 shows a circuit diagram of the conventional semiconductor integrated circuit (MT-CMOS).

FIG. 18 is a sectional view of a sixth embodiment of the semiconductor integrated circuit of the present invention.

This semiconductor integrated circuit includes a p type well 90, a p type well 91, an n type well 93, an n type well 92, isolation layers 94 and 95, a p type region 96, and an n type region 97. The remaining portions are the same and function the same as the embodiment shown in FIG. 14. The n type MOS transistor Q2 is formed in the p type well 90. The n type semiconductor regions 21*a* and 21*e* are a source region and a drain region of the n type MOS transistor Q2, respectively. The n type MOS transistors(TN1, TN2) are formed in the p type well 91. The p type MOS transistor Q1 is formed in the n type well 92. The p type semiconductor regions 22*a* and 22*e* are a source region and a drain region of the p type MOS transistor Q1, respectively. The p type MOS transistors (TP1, TP2) are formed in the type n well 93. The isolation layer 94 electrically isolates the p type well 90 and the p type well 91. The isolation layer 95 electrically isolates the n type well 92 and the n type well 93. The p type region 96 is a high impurity concentration region formed in the p type well 91. The n type region 97 is a high impurity concentration region formed in the n type well 93. The n type semiconductor region 21*b* is connected to the n type semiconductor region 21*e* by a wire such as GNDV. The p type semiconductor region 22*e* is connected to the p type semiconductor regions 22*b* and 22*d* by a wire such as VDDV.

The n type MOS transistors in the p type wells 90 and 91 are formed by the same process at the same time. The p type MOS transistors in the n type well 92 and 93 are formed by the same process at the same time. The threshold voltage of the n type MOS transistors is 0.2–0.3 V. The threshold voltage of the p type MOS transistors is −0.2−−0.3 V. Therefore, in this embodiment, the semiconductor integrated circuit exhibits a decreased leakage current.

The p type well 90 is supplied with the voltage GNDV from the low voltage generating circuit 61 through the p type region 23. The n type well 92 is supplied with the voltage from the high voltage generating circuit 62 through the n type region 24. The p type well 91 is always supplied with GND through the p type region 96. The n type well 93 is always supplied with VDD through the n type region 97.

Comparing the embodiment of FIG. 18 to that of FIG. 14, in FIG. 14, the low voltage generating circuit 61 supplies a voltage to the backgate of all MOS transistors in the p type well 2. The high voltage generating circuit 62 supplies a voltage to the backgate of all MOS transistors in the n type well 3. Therefore, the low voltage generating circuit 61 and the high voltage generating circuit 62 are burdened with a high load. To supply the high load, it is considered to expand the circuit scale of the low voltage generating circuit 61 and the high voltage generating circuit 62. However, such expansion increases the input power consumption. On the other hand, in the embodiment of FIG. 18, input power consumption is reduced because the low voltage generating circuit 61 supplies GND or VBB only to the p type well 90 and the high voltage generating circuit 62 supplies VDD or VPP only to the n type well 92. Therefore, the semiconductor integrated circuit of FIG. 18 effectively is provided with a small scale circuit design, decreased input power consumption, reduced switching time (from the standby state to the active state and from the active state to the standby state) because the charging and the discharging of electric charge to the p type well 2 and the n type well 3 is performed quickly.

(seventh embodiment)

A seventh embodiment of the present invention involves a variation of the embodiment shown in FIG. 13. In the seventh embodiment, the p type MOS transistor Q1 of FIG. 13 is deleted and the logic circuit 11 is connected directly to VDD. Changing from the standby state to the active state or from the active state to the standby state is achieved by controlling only the n type MOS transistor Q2. Alternatively, it is possible to delete the n type MOS transistor Q2 and connect the logic circuit 11 to GND directly, thereby to change state by only controlling the p type MOS transistor Q1.

Further, an n type MOS transistor may be formed between the logic circuit 11 and VDD, as shown in FIG. 12(A). In this case, the signal line S1 from the control circuit 12 is connected to the gate electrode of the n type MOS transistor which is connected between the logic circuit 11 and VDD and the signal line S3 from the low voltage generating circuit 61 is connected to the backgate of the n type MOS transistor as the back gate voltage.

Also, it is possible to delete the n type MOS transistor Q2 in FIG. 12(A) and connect the logic circuit 11 directly to GND.

Alternatively, it is possible to connect a p type MOS transistor between the logic circuit 11 and GND. In this case, the signal line S2 from the control circuit 12 is connected to the gate electrode of the p type MOS transistor which is connected between the logic circuit 11 and GND, and apply the signal line S4 from the high voltage generating circuit 62 to the n type MOS transistor as its backgate voltage.

Obviously, numerous additional modifications and variations of the present invention are possible in light of the above teachings. It is therefore to be understood that within the scope of the appended claims, the invention may be practiced otherwise than as specifically described herein.

What is new and desired to be secured by Letters Patent of the United States is:

1. A semiconductor integrated circuit, comprising:

first and second power supply terminals;

a first transistor connected to said first power supply terminal and coupled in series between said first and second power supply terminals, said first transistor having a first threshold voltage;

logic circuitry performing a logic function, said logic circuitry connected between said first transistor and said second power supply terminal and comprising a plurality of transistors having a second threshold voltage lower than said first threshold voltage;

control circuitry generating at least one control signal defining when said first transistor is to be operated in a non-conducting state and said logic circuitry is to be in a standby state; and voltage generating circuitry coupled to said control circuitry and responsive to said at least one control signal for generating a first control voltage which is greater in absolute value than a first standard power supply voltage and of a polarity which when applied to said first transistor renders said first transistor non-conductive, said voltage generating circuitry supplying said first control voltage to said first transistor to render the first transistor non-conductive.

2. A semiconductor integrated circuit in accordance with claim 1, further comprising:

a second transistor connected to said second power supply terminal and coupled in series with said logic circuitry and said first power supply terminal, said second transistor having the first threshold voltage;

said control circuitry generating a further control voltage defining when said second transistor is to be operated in a non-conducting state and said logic circuitry is to be in said standby state; and said voltage generating circuitry generating in response to said further control signal a second control voltage which is greater in absolute value than a second standard power supply voltage and which when applied to said second transistor renders said second transistor non-conductive, said voltage generating circuitry supplying said second control voltage to said second transistor to render the second transistor non-conductive.

3. A semiconductor integrated circuit in accordance with claim 2, wherein said logic circuitry is connected in series between said first and second transistors and separated from said first and second standard power supply voltages by said first and second transistors.

4. A semiconductor integrated circuit in accordance with claim 2, wherein:

said logic circuitry comprises first and second logic circuits;

said first logic circuit is connected between said first transistor and said second power supply terminal in series with said first power supply terminal, said first transistor, and said second power supply terminal; and said second logic circuit is connected between said second transistor and said first power supply terminal in series with said first power supply terminal, said second transistor and said second power supply terminal.

5. A semiconductor integrated circuit in accordance with claim 2, wherein:

said voltage generating circuitry supplies said first control voltage to a control terminal of said first transistor and said second control voltage to a control terminal of said second transistor when said logic circuitry is in the standby state.

6. A semiconductor integrated circuit in accordance with claim 1, further comprising:

a second transistor of the same conductivity type as the first transistor and connected to said second power supply terminal in series with said logic circuitry, said first transistor and said first power supply terminal, said second transistor having the first threshold voltage;

said at least one control signal generated by said control circuitry defining when said second transistor is operated in a non-conducting state and said logic circuitry is in said standby state; and said voltage generating circuitry supplying said first control voltage to said second transistor to render said second transistor non-conductive when said logic circuitry is to be in the standby state.

7. A semiconductor integrated circuit in accordance with claim 2, wherein said voltage generating circuitry comprises, a first voltage generating circuit for generating said first control voltage, second voltage generating circuit for generating said second control voltage, a first selecting circuit for supplying said second standard power supply voltage to a control terminal of said first transistor when said logic circuitry is in an active state and supplying said first control voltage from said first voltage generating circuit to the control terminal of said first transistor when said logic circuitry is in the standby state in accordance with said at least one control signal from said control circuitry, and a second selecting circuit for supplying said first standard power supply voltage to a control terminal of said second transistor when said logic circuitry is in the active state and supplying said second control voltage from said second voltage generating circuit to the control terminal of said second transistor when said logic circuitry is in the standby state in accordance with said further control signal from said control circuitry.

8. A semiconductor integrated circuit in accordance with claim 7, wherein said second voltage generating circuit comprises:

a ring oscillator having an odd number of inverters;

third and fourth transistors, said third transistor having a first terminal connected to a first terminal of said fourth transistor at a first node, and a second terminal connected to a control terminal of said third transistor, said fourth transistor having a control terminal connected to said first node, and a second standard terminal connected to said second power supply voltage; and a capacitor connected between an output terminal of said ring oscillator and said first node;

said second control voltage being output at said second terminal of said third transistor.

9. A semiconductor integrated circuit in accordance with claim 7, wherein said first voltage generating circuit comprises:

a ring oscillator having an odd number of inverters;

third and fourth transistors, said third transistor having a first terminal connected to a first terminal of said fourth transistor at a first node and a second terminal connected to a control terminal of said third transistor and said first standard power supply voltage, said fourth transistor having a control terminal connected to said first node and a second terminal at which said first control voltage is output; and a capacitor connected between an output terminal of said ring oscillator and said first node.

10. A semiconductor integrated circuit in accordance with claim 1, wherein the first threshold voltage is set to be about twice as great as the second threshold voltage.

11. A semiconductor integrated circuit in accordance with claim 1, wherein the first threshold voltage has an absolute value in the range of 0.5 v–0.7 v and the second threshold voltage has an absolute value in the range of 0.2 v–0.3 v.

12. A semiconductor integrated circuit in accordance with claim 2 wherein the first threshold voltage is set to be about twice as great as the second threshold voltage.

13. A semiconductor integrated circuit in accordance with claim 2, wherein the first threshold voltage has an absolute value in the range of 0.5 v–0.7 v and the second threshold voltage has an absolute value in the range of 0.2 v–0.3 v.

14. A semiconductor integrated circuit, comprising:

first and second power supply terminals;

a first transistor connected to said first power supply terminal and a second transistor connected to said second power supply terminal, said first and second transistors having a threshold voltage and being coupled in series between said first and second power supply terminals;

logic circuitry performing a logic function, said logic circuitry being connected between said first and second transistors and comprising a plurality of transistors having a substantially the same threshold voltage as said first and second transistors;

control circuitry for generating at least one control signal defining when said first and second transistors are to be operated in a non-conducting state and said logic circuitry is to be in a standby state; and voltage generating circuitry coupled to said control circuit and responsive to said at least one control signal to generate a first control voltage which is greater in absolute value than a first standard power supply voltage and of a polarity which when applied to said first transistor renders said first transistor non-conductive and a second control voltage which is greater in absolute value than a second standard power supply voltage and of a polarity which when applied to said second transistor renders the second transistor non-conductive, said voltage generating circuitry supplying said first and second control voltages to said first and second transistors, respectively, to render the first and second transistors non-conductive, wherein said voltage generating circuitry comprises, a first voltage generating circuit for generating said first control voltage, and a second voltage generating circuit for generating said second control voltage, wherein said second voltage, generating circuit comprises, a ring oscillator having an odd number of inverters, third and fourth transistors, said third transistor having a first terminal connected to a first terminal of said fourth transistor at a first node and a second terminal connected to a control terminal of said third transistor, said fourth transistor having a control terminal connected to said first node and a second terminal connected to said second standard power supply voltage, a capacitor connected between an output terminal of said ring oscillator and said first node, a fifth transistor connected across an input and an output of said ring oscillator and having a control terminal connected to an inverse of said at least one control signal from said control circuit, and a sixth transistor connected across said third and fourth transistors and having a control terminal connected to said at least one control signal from said control circuit.

15. A semiconductor integrated circuit in accordance with claim 14, comprising:

a semiconductor substrate having first and second wells of different conductivity type formed therein and separated by an isolation region, said first and second transistors formed in respective ones of said wells, and said logic circuitry comprising first and second portions formed in respective ones of said first and second wells.

16. A semiconductor integrated circuit in accordance with claim 15, wherein said first well is connected to said first power supply terminal, said second well is connected to said second power supply terminal, said first transistor has a control terminal connected to said first control voltage, and said second transistor has a control terminal connected to said second control voltage.

17. A semiconductor integrated circuit in accordance with claim 15, wherein said control circuitry generates first and second complementary control signals respectively applied to a control terminal of said second transistor and a control terminal of said first transistor, and wherein said first control voltage is applied to an electrode in said first well, and said second control voltage is applied to an electrode in said second well.

18. A semiconductor integrated circuit in accordance with claim 14, comprising:

a semiconductor substrate having first and second wells of a first conductivity type formed therein and separated by a first isolation region, and third and fourth wells of a second conductivity type and separated by a second isolation region, said first and second transistors formed in respective ones of said first and fourth wells, and said logic circuitry comprising first and second portions formed in respective ones of said second and third wells and separated by a third isolation region.

19. A semiconductor integrated circuit in accordance with claim 18, wherein said control circuitry generates first and second complementary control signals which are applied to a control terminal of second transistor and a control terminal of said first transistor, and wherein said first control voltage is applied to an electrode in said first well, said second well is connected to said first power supply terminal, said third well is connected to said second power supply terminal, and said second control voltage is applied to an electrode of said fourth well.

20. A semiconductor integrated circuit, comprising:

first and second power supply terminals;

a first transistor connected to said first power supply terminal and a second transistor connected to said second power supply terminal, said first and second transistors having a threshold voltage and being coupled in series between said first and second power supply terminals;

logic circuitry performing a logic function, said logic circuitry being connected between said first and second transistors and comprising a plurality of transistors having a substantially the same threshold voltage as said first and second transistors;

control circuitry for generating at least one control signal defining when said first and second transistors are to be operated in a non-conducting state and said logic circuitry is to be in a standby state; and voltage generating circuitry coupled to said control circuit and responsive to said at least one control signal to generate a first control voltage which is greater in absolute value than a first standard power supply voltage and of a polarity which when applied to said first transistor renders said first transistor non-conductive and a second control voltage which is greater in absolute value than a second standard power supply voltage and of a polarity which when applied to said second transistor renders the second transistor non-conductive, said voltage generating circuitry supplying said first and second control voltages to said first and second transistors, respectively, to render the first and second transistors non-conductive, wherein said voltage generating circuitry comprises, a first voltage generating circuit for generating said first control voltage, wherein said first voltage generating circuit comprises, a ring oscillator having an odd number of inverters, third and fourth transistors, said third transistor having a first terminal connected to a first terminal of said fourth transistor at a first node, and a second terminal connected to a control terminal of said third transistor, said fourth transistor having a control terminal connected to said first node, and a second terminal connected to said second standard power supply voltage, a capacitor connected between an output terminal of said ring oscillator and said first node, a fifth transistor connected across an input and an output of said ring oscillator and having a control terminal connected to said at least one control signal from said control circuit, a sixth transistor connected across said third and fourth transistors and having a control terminal connected to an inverse of said at least one control signal from said control circuit; and a second voltage generating circuit for generating said second control voltage.

21. A semiconductor integrated circuit in accordance with claim 20, comprising:

a semiconductor substrate having first and second wells of different conductivity type formed therein and separated by an isolation region, said first and second transistors formed in respective ones of said wells, and said logic circuitry comprising first and second portions formed in respective ones of said first and second wells.

22. A semiconductor integrated circuit in accordance with claim 21, wherein said first well is connected to said first power supply terminal, said second well is connected to said second power supply terminal, said first transistor has a control terminal connected to said first control voltage, and said second transistor has a control terminal connected to said second control voltage.

23. A semiconductor integrated circuit in accordance with claim 21, wherein said control circuitry generates first and second complementary control signals respectively applied to a control terminal of said second transistor and a control terminal of said first transistor, and wherein said first control voltage is applied to an electrode in said first well and said second control voltage is applied to an electrode in said second well.

24. A semiconductor integrated circuit in accordance with claim 20, comprising:

a semiconductor substrate having first and second wells of a first conductivity type formed therein and separated by a first isolation region, and third and fourth wells of a second conductivity type and separated by a second isolation region, said first and second transistors formed in respective ones of said first and fourth wells, and said logic circuitry comprising first and second portions formed in respective ones of said second and third wells and separated by a third isolation region.

25. A semiconductor integrated circuit in accordance with claim 24, wherein said control circuitry generates first and second complementary control signals which are applied to a control terminal of second transistor and a control terminal of said first transistor, and wherein said first control voltage is applied to an electrode in said first well, said second well is connected to said first power supply terminal, said third well is connected to said second power supply terminal, and said second control voltage is applied to an electrode of said fourth well.

26. A semiconductor integrated circuit device comprising:

a logic circuit including transistors;

a first field effect transistor coupled between a conductive electrode of at least one of the transistors in said logic circuit and a power supply terminal;

a control circuit coupled to a gate electrode of said first field effect transistor, said control circuit controlling said first field effect transistor to be rendered conductive in an active state of said logic circuit and to be rendered non-conductive in a standby state of said logic circuit; and a first voltage generating circuit for generating a first signal having a first voltage when said first field effect transistor is rendered conductive and a second voltage different from the first voltage when said first field effect transistor is rendered non-conductive, said first signal being applied to a back gate electrode of said first field effect transistor.

27. The semiconductor integrated circuit device according to claim 26, wherein said first field effect transistor is a p-type transistor and the first voltage is lower than the second voltage.

28. The semiconductor integrated circuit device according to claim 27, wherein said first voltage generating circuit comprises:

an output terminal for outputting said first signal;

a capacitor having one end connected to a node;

a second field effect transistor having a first conductive electrode connected to said power supply terminal, a second conductive electrode connected to said node and a gate connected to the first conductive electrode;

a third field effect transistor having a first conductive electrode connected to said node, a second conductive terminal connected to said output terminal and a gate connected to the first conductive electrode of said third field effect transistor;

a ring oscillator, an output of which is connected to another end of said capacitor, said ring oscillator including a plurality inverters connected in a ring;

a fourth transistor inserted between two inverters among said plurality of inverters; and a fifth transistor connected between said power supply terminal and said output terminal, wherein said fourth and fifth transistors are rendered complimentarily conductive in accordance with a control signal output from said control circuit.

29. The semiconductor integrated circuit device according to claim 26, wherein said first field effect transistor is an n-type transistor and the first voltage is higher than the second voltage.

30. The semiconductor integrated circuit device according to claim 29, wherein said first voltage generating circuit comprises:

an output terminal for outputting said first signal;

a capacitor having one end connected to a node;

a second field effect transistor having a first conductive electrode connected to said output terminal, a second conductive electrode connected to said node and a gate connected to the first conductive electrode;

a third field effect transistor having a first conductive electrode connected to said node, a second conductive terminal connected to said power supply terminal and a gate connected to the first conductive electrode of said third field effect transistor;

a ring oscillator, an output of which is connected to another end of said capacitor, said ring oscillator including a plurality of inverters connected in a ring;

a fourth transistor inserted between two inverters among said plurality of inverters; and a fifth transistor connected between said power supply terminal and said output terminal, wherein said fourth and fifth transistors are rendered complementary conductive in accordance with a control signal output from said control circuit.

31. The semiconductor integrated circuit device according to claim 26, further comprising:

a second field effect transistor, a conductive type of which is different from said first field effect transistor, said second field effect transistor being coupled between another power supply terminal and a conductive electrode of another of the transistors in said logic circuit; and a second voltage generating circuit for generating a second signal having a third voltage when said second field effect transistor is rendered conductive and a fourth voltage different from the third voltage when said second field effect transistor is rendered non-conductive, said second signal being applied to a back gate electrode of said first field effect transistor, wherein said control circuit is coupled to a gate electrode of said second field effect transistor and controls said second field effect transistor to be rendered conductive in the active state of said logic circuit and to be rendered non-conductive in the standby state of said logic circuit.

32. The semiconductor integrated circuit device according to claim 26, wherein said logic circuit, said first field effect transistor, said control circuit, and said control circuit, and said first voltage generating circuit are integrated on a main surface of a semiconductor substrate, and a first semiconductor well and a second semiconductor well of the same conductive type are formed on the main surface of said semiconductor substrate and are electrically insulated, with said first signal being applied to a said first semiconductor well, wherein said first field effect transistor is formed on said first semiconductor well and said at least one of the transistors included in said logic circuit is formed on said second semiconductor well.

33. The semiconductor integrated circuit device according to claim 27, wherein the first voltage is substantially equal to a voltage applied for said power supply terminal.

34. The semiconductor integrated circuit device according to claim 29, wherein the first voltage is substantially equal to a voltage applied for said power supply terminal.

* * * * *